United States Patent
Moon et al.

(10) Patent No.: US 9,680,069 B2
(45) Date of Patent: Jun. 13, 2017

(54) LIGHT EMITTING DEVICE PACKAGE, WAVELENGTH CONVERSION FILM, AND MANUFACTURING METHOD THEREOF

(71) Applicant: SAMSUNG ELECTRONICS CO., LTD., Suwon-si (KR)

(72) Inventors: Kyung Mi Moon, Suwon-si (KR); Won Soo Ji, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/098,123

(22) Filed: Apr. 13, 2016

(65) Prior Publication Data
US 2016/0359089 A1    Dec. 8, 2016

(30) Foreign Application Priority Data

Jun. 8, 2015 (KR) .................. 10-2015-0080778

(51) Int. Cl.
*H01L 33/00* (2010.01)
*H01L 33/50* (2010.01)

(52) U.S. Cl.
CPC .......... *H01L 33/504* (2013.01); *H01L 33/507* (2013.01); *H01L 2224/16225* (2013.01); *H01L 2933/0041* (2013.01)

(58) Field of Classification Search
CPC ................. H01L 33/504; H01L 33/507; H01L 2933/0041
USPC ........................................................... 257/98
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| JP | 2008-209522 A | 9/2008 |
| JP | 2011-23560 A | 2/2011 |
| JP | 201493398 A | 5/2014 |

*Primary Examiner* — Tu-Tu Ho
(74) *Attorney, Agent, or Firm* — Sughrue Mion, PLLC

(57) ABSTRACT

A light emitting device package is provided. The package includes a light emitting device including a substrate, and a light emitting structure having a first conductivity-type semiconductor layer, an active layer, and a second conductivity-type semiconductor layer stacked on the substrate; and a wavelength conversion film disposed in a path of light emitted by the light emitting device and having phosphor layers stacked on each other. A portion of the phosphor layers includes phosphor structures including a wavelength conversion material receiving light emitted from the light emitting device and converting a wavelength thereof and a binding resin binding the wavelength conversion material, and a transparent resin filling spaces between the phosphor structures.

19 Claims, 26 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,863,636 B2 | 1/2011 | Sakata et al. |
| 7,884,538 B2 * | 2/2011 | Mitsuishi .............. H01L 33/504 313/501 |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0173883 A1 | 7/2008 | Hussell et al. |
| 2009/0058256 A1 * | 3/2009 | Mitsuishi .............. H01L 33/504 313/487 |
| 2011/0068676 A1 | 3/2011 | Jeon et al. |
| 2011/0297981 A1 | 12/2011 | Liao et al. |
| 2012/0228653 A1 | 9/2012 | Ishida et al. |
| 2014/0151740 A1 | 6/2014 | Tseng et al. |

* cited by examiner

LIGHT EMITTING DEVICE PACKAGE, WAVELENGTH CONVERSION FILM, AND MANUFACTURING METHOD THEREOF

CROSS-REFERENCE TO RELATED APPLICATION

This application claims the priority from Korean Patent Application No. 10-2015-0080778 filed on Jun. 8, 2015, with the Korean Intellectual Property Office, the disclosure of which is herein incorporated by reference.

BACKGROUND

Apparatuses, devices, articles of manufacture and methods consistent with the present disclosure relate to a light emitting device package, a wavelength conversion film, and a manufacturing method thereof.

In general, a light emitting device package that includes a light source including a semiconductor light emitting device such as a light emitting diode (LED), or the like, is applied to various lighting systems, backlight modules of display devices, and headlamps for vehicles. The light emitting device package may convert a wavelength of light emitted from a semiconductor light emitting device. However, there is a disadvantage in that, when the wavelength is converted, a light extraction efficiency and a light conversion efficiency are degraded.

SUMMARY

It is an aspect to provide a wavelength conversion film having high light extraction efficiency and light conversion efficiency, and a light emitting device package including the same.

According to an aspect of one or more example embodiments, there is provided a light emitting device package comprising a light emitting device including a substrate, and a light emitting structure having a first conductivity-type semiconductor layer, an active layer, and a second conductivity-type semiconductor layer stacked on the substrate; and a wavelength conversion film disposed in a path of light emitted by the light emitting device and having a plurality of phosphor layers stacked on each other, wherein at least a portion of the plurality of phosphor layers includes a plurality of phosphor structures comprising a wavelength conversion material receiving light emitted from the light emitting device and converting a wavelength thereof and a binding resin binding the wavelength conversion material, and a transparent resin filling spaces between the plurality of phosphor structures.

According to another aspect of one or more example embodiments, there is provided a wavelength conversion film comprising a plurality of phosphor structures, each comprising a wavelength conversion material and a binding resin binding the wavelength conversion material; and a transparent resin filling spaces between the plurality of phosphor structures, wherein at least a portion of the plurality of phosphor structures are stacked on each other to provide a plurality of phosphor layers.

According to another aspect of one or more example embodiments, there is provided a method of manufacturing a wavelength conversion film, the method comprising forming a plurality of phosphor layers including a plurality of phosphor structures and a transparent resin filling spaces between the plurality of phosphor structures, by using three-dimensional (3D) printing, each of the plurality of phosphor structures comprising a wavelength conversion material and a binding resin binding the wavelength conversion material; and stacking the plurality of phosphor layers, wherein the forming of the plurality of phosphor layers includes injection-molding the binding resin containing the wavelength conversion material to have a shape on the basis of data for forming the plurality of phosphor structures; curing the binding resin to form the plurality of phosphor structures; and filling spaces between the plurality of phosphor structures with the transparent resin and curing the transparent resin.

According to another aspect of one or more example embodiments, there is provided a light emitting device package comprising a light emitting device that emits light along an optical path; and a wavelength conversion film disposed in the optical path to convert a wavelength of the light, the wavelength conversion film comprising a first phosphor layer including a plurality of first phosphor structures, each first phosphor structure comprising a first wavelength conversion material and a first binding resin binding the first wavelength conversion material, the first phosphor layer comprising a first transparent resin between the plurality of first phosphor structures; and a second phosphor layer including a plurality of second phosphor structures, each second phosphor structure comprising a second wavelength conversion material and a second binding resin binding the first wavelength conversion material, the second phosphor layer comprising a second transparent resin between the plurality of second phosphor structures.

BRIEF DESCRIPTION OF DRAWINGS

The above and other aspects will be more clearly understood from the following detailed description taken in conjunction with the accompanying drawings, in which.

DETAILED DESCRIPTION

Figure 1:
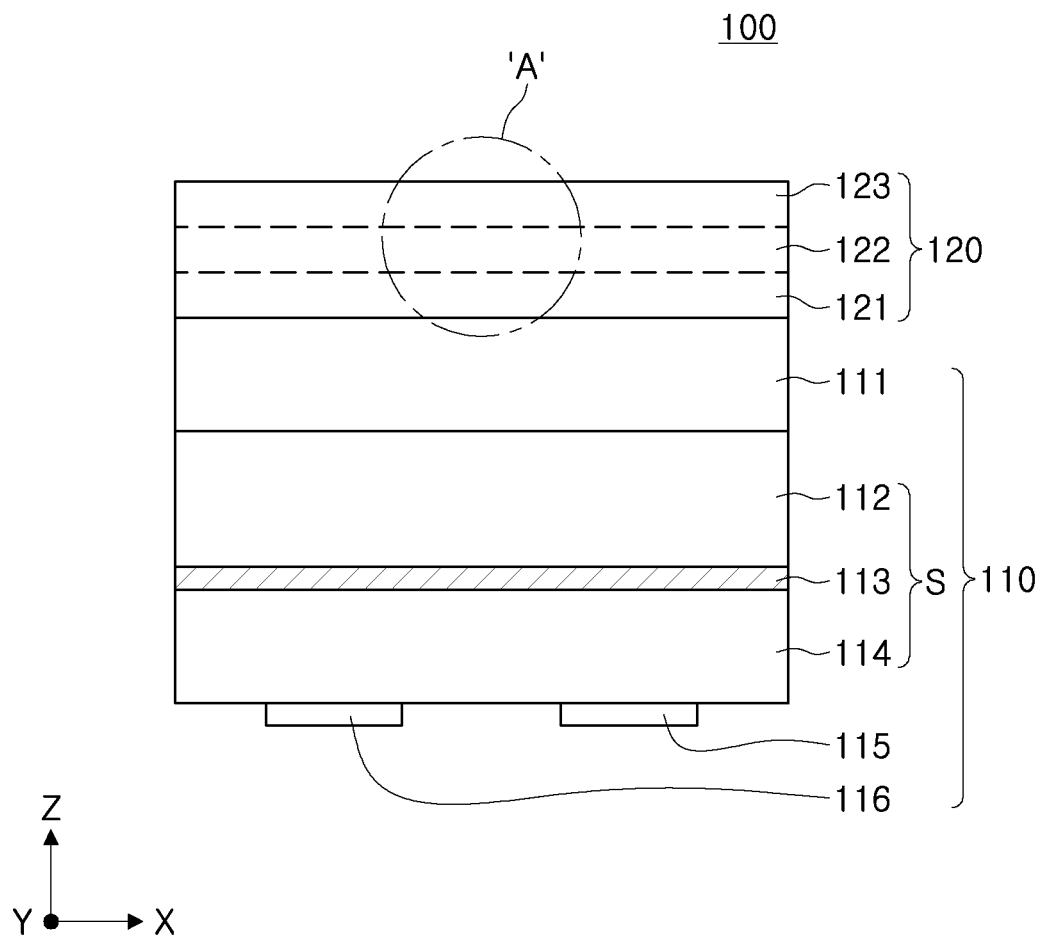
FIG. 1 is a view illustrating a light emitting device package according to an example embodiment.

Example embodiments will now be described in detail with reference to the accompanying drawings.

Throughout the specification, it will be understood that when an element such as a film, a region, or a wafer (substrate) is referred to as being positioned to be "on" or "connected to" another element, it can be on, connected, or coupled to the other element, or intervening elements may be present. However, when an element is referred to as being positioned to be "directly on" or "directly connected to", or "directly coupled to" another element, it will be understood that intervening elements are not present. The same reference numerals will be used throughout to designate the same or like elements. As used herein, the term "and/or" includes any and all combinations of one or more of the associated listed items.

Also, although terms such as "first" and "second" are used to describe various members, components, regions, layers, and/or portions in various example embodiments, the members, components, regions, layers, and/or portions are not limited to these terms. These terms are used only to differentiate one member, component, region, layer, or portion from others thereof. Therefore, a member, a component, a region, a layer, or a portion referred to as a "first" member, a "first" component, a "first" region, a "first" layer, or a "first" portion in an example embodiment may be referred to as a "second" member, a "second" component, a "second" region, a "second" layer, or a "second" portion in another example embodiment.

Also, relative terms such as "on", "upper", "under", or "below" may be used to describe relationships of certain elements to other elements as depicted in the drawings. Relative terms may be understood as intending the inclusion of other directions of a device in addition to directions illustrated in the drawings. For example, when a device is turned over in the drawings, elements illustrated to be present on surfaces of other elements may be oriented under the foregoing other elements. Thus, for example, the term "on" may include both directions of "under" and "on" relying on a particular orientation of drawings. When an element is oriented in a different direction (e.g., rotated 90 degrees with respect to the different direction), relative descriptions used in this disclosure may be interpreted accordingly.

The technical terms used in this disclosure are only used to explain a specific example embodiment while not limiting the present invention. The terms of a singular form may include plural forms unless the description is contrary. Also, it will be further understood that the terms "comprise" and/or "comprising," when used herein, specify the presence of stated features, integers, steps, operations, elements, and/or components, but do not preclude the presence or addition of one or more other features, steps, operations, elements, components, and/or groups thereof.

Hereinafter, ideal example embodiments will be described with reference to the accompanying drawings. In the accompanying drawings, for example, modifications of an illustrated shape may be expected according to manufacturing technology and/or tolerance. Therefore, example embodiments should not be construed as being limited to a specific shape of a region illustrated in the drawings, and for example, should include a change of shape caused in a manufacturing process. Hereinafter, one or a plurality of example embodiments may be combined to be configured.

The contents described hereinafter may have various components, and only components for conveying the contents will be illustrated, and the contents of the present inventive concept are not limited thereto.

A light emitting device package may include a wavelength conversion material for converting a wavelength of light emitted from a semiconductor light emitting device, and the wavelength conversion material may be included in a resin provided in the form of a film so as to be applied to the light emitting device package.

In a case in which a light emitting package device is manufactured using a wavelength conversion film formed by sealing a wavelength conversion material in a resin, a degradation of light uniformity due to precipitation of a wavelength conversion material, or the like, may be prevented, in comparison to a case in which a wavelength conversion material is included in a binding resin for protecting a semiconductor light emitting device. Recently, research into enhancement of light extraction efficiency by forming an irregular pattern on a surface of a wavelength conversion film or adjusting a thickness of the wavelength conversion film has been actively conducted.

FIG. 1 is a view illustrating a light emitting device package according to an example embodiment.

Referring to FIG. 1, a light emitting device package 100 may include a light emitting device 110 and a wavelength conversion film 120 disposed in a path in which light emitted by the light emitting device 110 emits travels. The structure of the light emitting device 110 illustrated in the example embodiment of FIG. 1 is merely illustrative and is not limited thereto.

The light emitting device 110 may include a substrate 111, a light emitting structure S having a first conductivity-type semiconductor layer 112, an active layer 113, and a second conductivity-type semiconductor layer 114 stacked on the substrate 111, and a first electrode 115 and a second electrode 116. The first electrode 115 may be electrically connected to the first conductivity-type semiconductor layer 112 through the active layer 113 and the second conductivity-type semiconductor layer 114 by a via hole, or the like, such that the first electrode 115 does not electrically couple to the active layer 113 or the second conductivity-type semiconductor layer 114. The second electrode 116 may be electrically connected to the second conductivity-type semiconductor layer 114. The first and second electrodes 115 and 116 may be electrically connected to a package board or a circuit board, and in an example embodiment, the first and second electrodes 115 and 116 may be bonded in a flip-chip manner.

In an example embodiment, the first conductivity-type semiconductor layer 112 may be an n-type nitride semiconductor layer, and the second conductivity-type semiconductor layer 114 may be a p-type nitride semiconductor layer. Here, due to the characteristics of the p-type nitride semiconductor having a resistance higher than that of the n-type nitride semiconductor layer, ohmic contact between the second conductivity-type semiconductor layer 114 and the second electrode 116 may be difficult to make. Thus, in order to secure ohmic contact between the second electrode 116 and the second conductivity-type semiconductor layer 114, the second electrode 116 and the second conductivity-type semiconductor layer 114 may be in contact over a relatively large area. That is, the second electrode 116 may have a relatively large surface area, compared with the first electrode 115.

Also, in terms of the characteristics of the light emitting device 110 in which light is extracted mainly in a direction in which the substrate 111 is attached (upwardly in the Z axis direction in the example of FIG. 1), the first and second electrodes 115 and 116 may be formed of a material having a high level of reflectivity to increase light extraction efficiency of the light emitting device package 100. In order to reflect light generated by the active layer 113 based on electron-hole recombination and give off the generated light outwardly through the substrate 111, the first and second electrodes 115 and 116 may include a material having excellent reflectivity such as silver (Ag), nickel (Ni), aluminum (Al), rhodium (Rh), palladium (Pd), iridium (Jr), ruthenium (Ru), magnesium (Mg), zinc (Zn), platinum (Pt), and gold (Au).

In various example embodiments, the wavelength conversion film 120 may include a plurality of phosphor layers 121, 122, and 123 stacked on each other. The plurality of phosphor layers 121, 122, and 123 may be stacked on each other in the same direction as a stacking direction (the Z axis direction in the example of FIG. 1) of the light emitting structure S. Thicknesses of the plurality of phosphor layers 121, 122, and 123 may be the same or different from one another.

At least a portion of the plurality of phosphor layers 121, 122, and 123 may include a plurality of phosphor structures that receive light emitted from the light emitting device 110 and change a wavelength thereof. The plurality of phosphor structures may have a three-dimensional (3D) structure such as a polygonal shape, a rod shape extending in a specific direction, or a fiber shape irregularly extending in a random direction. A diameter or a width of a cross-section of the phosphor structures is not limited, but the diameter or the width of the cross-section may have a size sufficient for containing a wavelength conversion material. For example, the diameter or the width may be about 10 µm or greater.

The plurality of phosphor structures may include a wavelength conversion material such as a phosphor or a quantum dot, and a binding resin binding the wavelength conversion material. In order to form the plurality of phosphor structures having a diameter or a width having a micrometer scale, a 3D printing technique may be used. In this case, the binding resin containing the wavelength conversion material, such as a phosphor or a quantum dot, is injection-molded using a 3D printing technique to obtain a desired 3D shape, and cured by ultraviolet (UV) rays or a laser to form a plurality of phosphor structures. Here, the binding resin may be a thermosetting resin easily cured by the UV rays or a laser, and may have excellent light transmission.

The plurality of the phosphor layers 121, 122, and 123 each may include a transparent resin. The transparent resin may be a base layer forming the plurality of phosphors layers 121, 122, and 123, and may fill spaces between the plurality of phosphor structures. Filling the spaces between the plurality of phosphor structures with an epoxy or silicon resin may lead to an effect of enhancing light extraction efficiency of light emitted from the light emitting device 110 and protecting the light emitting device 110. Also, since strength of the wavelength conversion film 120 is enhanced, an advantageous effect may be obtained in the process of manufacturing the light emitting device package 100.

Each of the plurality of phosphor structures may include a wavelength conversion material by about 70 vol % or greater. Since the wavelength conversion material is included in the plurality of phosphor structures by a high volume percentage, when the binding resin, which binds the wavelength conversion material, and the transparent resin include the same material, the plurality of phosphor structures may be distinguished from the transparent resin within the wavelength conversion film 120.

Hereinafter, the wavelength conversion film 120 according to various example embodiments will be described with reference to FIGS. 2 through 5.

Figure 2:
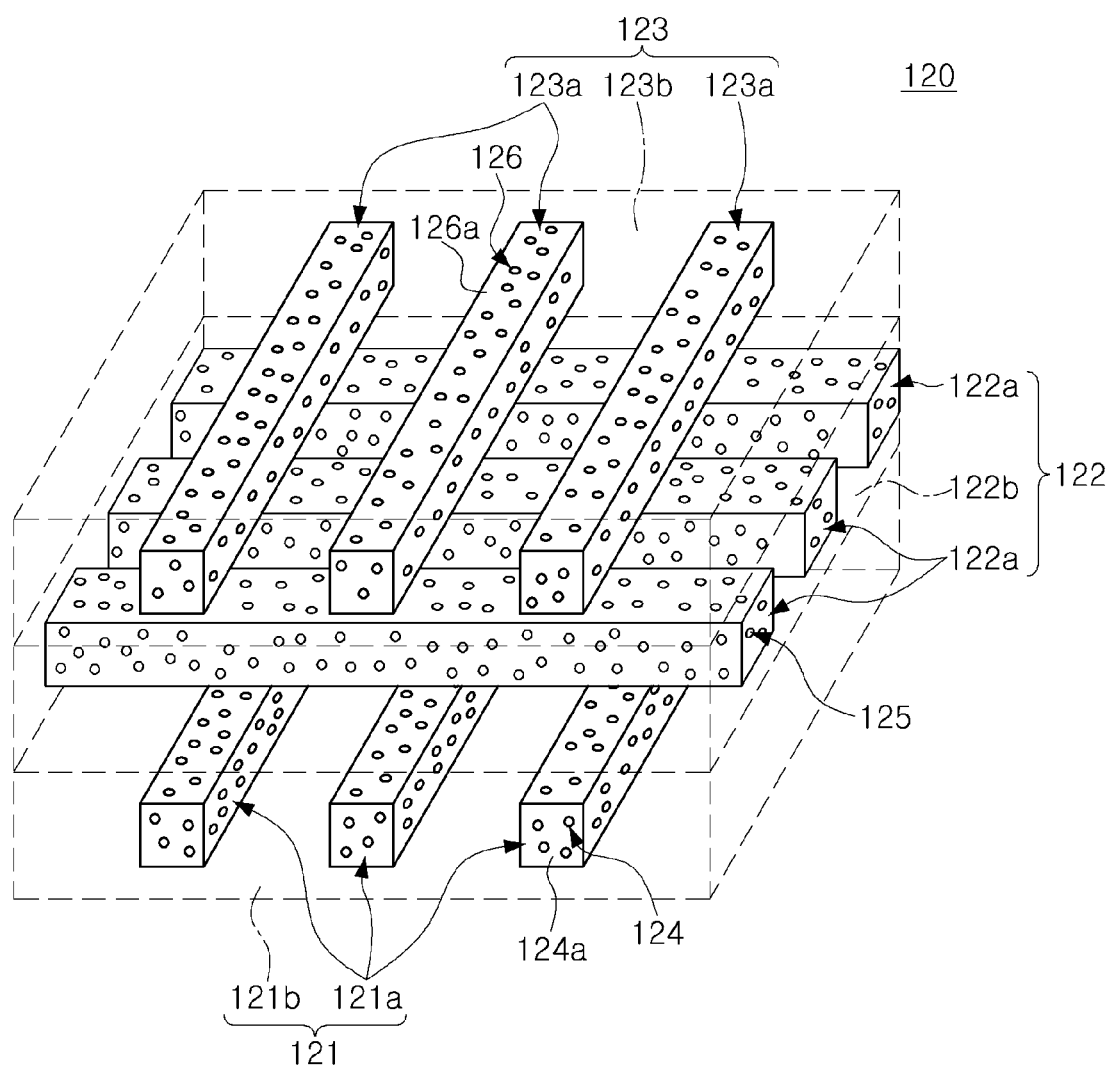
FIG. 2 is an enlarged view of a portion "A" of the light emitting device package illustrated in FIG. 1.

FIG. 2 is an enlarged view of a portion "A" of the light emitting device package illustrated in FIG. 1.

Referring to FIG. 2, the wavelength conversion film 120 according to an example embodiment may include a plurality of phosphor layers 121, 122, and 123, and each of the phosphor layers 121, 122, and 123 may include a plurality of phosphor structures 121a, 122a, and 123a and transparent resins 121b, 122b, and 123b filling spaces between the plurality of phosphor structures 121a, 122a, and 123a, respectively. In other words, the transparent resin 121b fills spaces between the plurality of phosphor structures 121a, and transparent resin 122b fills spaces between the plurality of phosphor structures 122a, and so on. In the example embodiment illustrated in FIG. 2, the plurality of phosphor structures 121a, 122a, and 123a are each illustrated to have a rod shape extending in a specific direction (X axis direction or Y axis direction in the example of FIG. 2) and spaced apart from one another by an interval in the specific direction, but the shape of each the plurality of phosphor structures 121a, 122a, and 123a and the spacing thereof is not limited thereto. For example, each of the plurality of phosphor structures 121a, 122a, and 123a may have a polygonal rod shape, a circular rod shape, or any other various shapes other than the rod shape. Moreover, the shapes of the plurality of phosphor structures 121a, 122a, and 123a may be different or the same. For example, the plurality of phosphor structures 121a may have the same or different shapes, and the plurality of phosphor structures 122a may have the same or different shapes, which may again be the same or different as those of the phosphor structures 121a. The interval may be predetermined.

The plurality of phosphor structures 121a, 122a, and 123a may include wavelength conversion materials 124, 125, and 126, respectively, and binder resins 124a, 125a, 126a, respectively, that bind the respective wavelength conversion materials 124, 125, 126. The wavelength conversion materials 124, 125, and 126 may be phosphors or quantum dots. In an example embodiment, the plurality of phosphor structures 121a, 122a, and 123a may be formed by injection-molding a thermosetting resin containing the wavelength conversion materials 124, 125, and 126 using 3D printing and subsequently curing the thermosetting resin with UV rays or a laser. Here, a shape of the plurality of phosphor structures 121a, 122a, and 123a may be determined by data provided for 3D printing. In other words, the shape of each of the plurality of phosphor structures 121a, 122a, and 123a is shown in FIG. 2 as a long rectangular shape. However, this is only an example and various other shapes are contemplated. Additionally, as discussed above, the plurality of phosphor structures 121a, 122a, and 123a may have a same shape or different shapes.

In the example embodiment illustrated in FIG. 2, it is assumed that the wavelength conversion film 120 is formed by stacking three phosphor layers 121, 122, and 123, but this is merely an example embodiment, and the configuration of the wavelength conversion film 120 is not limited thereto. For example, the number of layers is not particularly limited and may be greater or less than three. The plurality of phosphor structures 121a and 123a respectively included in the first phosphor layer 121 and the third phosphor layer 123 may extend in a first direction (X axis direction in the example of FIG. 2) and the plurality of phosphor structures 122a included in the second phosphor layer 122 may extend in a second direction (Y axis direction in the example of FIG. 2) intersecting with the first direction. That is, in the example embodiment illustrated in FIG. 2, the plurality of phosphor structures 121a, 122a, and 123a may have a 3D matrix form. While FIG. 2 illustrates that the first direction is an X axis direction and the second direction is a Y axis direction and thus is at a right angle to the X axis direction, in some example embodiments the first direction may intersect the second direction at an angle that is not a right angle.

The plurality of phosphor structures 121a, 122a, and 123a may be arranged in various other forms instead of the 3D matrix form. In an example embodiment, since the phosphor layers 121, 122, and 123 are stacked on each other in the stacking direction, the plurality of phosphor structures 121a, 122a, and 123a may be realized as various structures in which the plurality of phosphor structures 121a, 122a, and 123a are stacked on each other. In other words, the plurality of phosphor structures 122a are stacked on the plurality of phosphor structures 121a, and the plurality of phosphor structures 123a are stacked on the plurality of phosphor structures 122a in the stacking direction (e.g., the Z direction). In this manner, since the plurality of phosphor structures 121a, 122a, and 123a are disposed to have a stacked structure in which the plurality of phosphor structures 121a, 122a, and 123a are positioned in different layers, rather than being disposed on the same 2D plane, a surface area of the plurality of phosphor structures 121a, 122a, and 123a having the wavelength conversion materials 124, 125, and 126, respectively, may be increased, and thus, light conversion efficiency may be enhanced. The plurality of phosphor structures 121a, 122a, and 123a may have a structure in which the plurality of phosphor structures 121a, 122a, and 123a are stacked on each other, and thus, each of the plurality of phosphor structures 121a, 122a, and 123a may have different shapes.

The wavelength conversion materials 124, 125, and 126 included respectively in the plurality of phosphor structures 121a, 122a, and 123a included in the phosphor layers 121, 122, and 123, respectively, may be the same or different. For example, in a case in which the light emitting device 110 emits blue light, phosphors or quantum dots absorbing blue light to emit yellow light may be provided as the wavelength conversion materials 124, 125, and 126 to realize the light emitting device package 100.

Also, in another example embodiment, the wavelength conversion materials 124, 125, and 126 may be phosphors or quantum dots emitting different colors of light. In a case in which a light emitting device package 100 emitting white light is provided, the wavelength conversion materials 124, 125, and 126 may be realized as phosphors or quantum dots emitting light such that portions thereof emit light of different colors, whereby the light emitting device package 100 may emit white light. Here, a phosphor or a quantum dot emitting light having a relatively long wavelength may be included in a layer among the phosphor layers 121, 122, and 123 that is relatively close to the light emitting device 110. For example, the first phosphor layer 121 may include a wavelength conversion material 124 emitting red light, and the second and third phosphor layers 122 and 123 may respectively include wavelength conversion materials 125 and 126 emitting green light.

Thicknesses of the phosphor layers 121, 122, and 123 may be variously modified according to characteristics of the light emitting device package 100. For example, in a case in which a large beam angle is to be obtained, the thicknesses of the phosphor layers 121, 122, and 123 may be increased. The thicknesses of the phosphor layers 121, 122, and 123 may be equal to or different from the diameters or heights of the plurality of phosphor structures 121a, 122a, and 123a, respectively. When the diameters or heights of the plurality of phosphor structures 121a, 122a, and 123a are smaller than the thicknesses of the phosphor layers 121, 122, and 123, respectively, the other remaining spaces of the phosphor layers 121, 122, and 123 in the height direction (Z axis direction) may be filled with the transparent resins 121b, 122b, and 123b, respectively.

That is, the spaces between the plurality of phosphor structures 121a, 122a, and 123a may be filled with the transparent resins 121b, 122b, and 123b, respectively. When the spaces between the plurality of phosphor structures 121a, 122a, and 123a are filled with the transparent resins 121b, 122b, and 123b, respectively, an effect of increasing extraction efficiency of light emitted from the light emitting device 110 and increasing support for the plurality of phosphor structures 121a, 122a, and 123a may be obtained. Also, since a portion of an upper surface of the substrate 111 of the light emitting device 110 is prevented from being exposed outwardly (see FIG. 1), the light emitting device 110 may be protected and an adhesive strength between the wavelength conversion film 120 and the light emitting device 110 may be increased, improving reliability.

The wavelength conversion film 120 illustrated in FIG. 2 may be manufactured using a 3D printing technique. Binding resins 124a, 125a, and 126a including the wavelength conversion materials 124, 125, and 126, respectively is injection-molded to have a shape on the basis of data including information regarding a shape, a size, and a disposition of the plurality of phosphor structures 121a, 122a, and 123a, respectively, and cured to manufacture the plurality of phosphor structures 121a, 122a, and 123a. Here, a thermosetting resin that may be cured with UV rays or a laser may be selected as the binding resin. The shape may be predetermined.

After the plurality of phosphor structures 121a, 122a, and 123a are formed, spaces between the plurality of phosphor structures 121a, 122a, and 123a may be filled with the transparent resins 121b, 122b, and 123b, respectively. After the plurality of phosphor structures 121a are formed and spaces therebetween are filled with the transparent resin 121b to form the first phosphor layer 121, the plurality of second phosphor structures 122a are formed on the first phosphor layer 121 and spaces therebetween are filled with the transparent resin 122b to form the second phosphor layer 122. This process is repeatedly performed to manufacture the wavelength conversion film 120 having the plurality of phosphor layers 121, 122, and 123 through a 3D printing technique.

Figure 3:
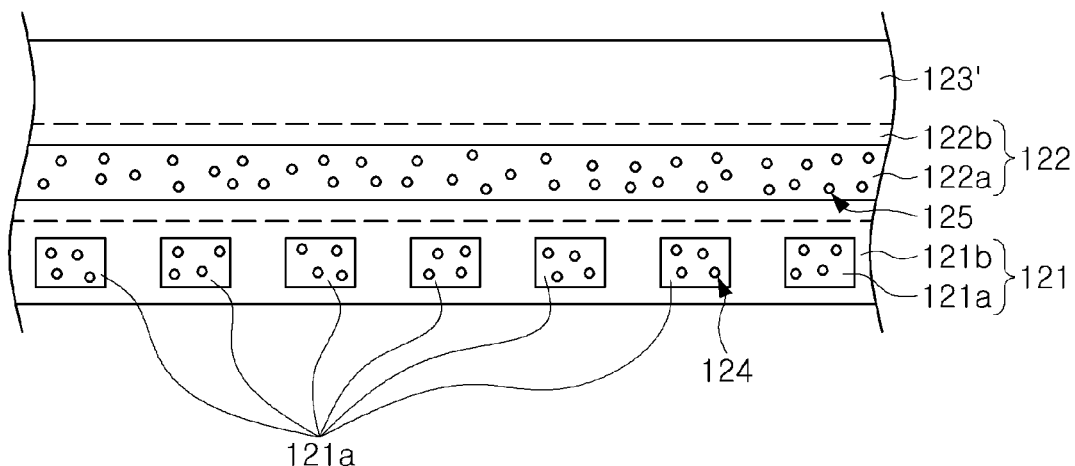
FIGS. 3 through 5 are cross-sectional views illustrating a structure of a wavelength conversion film applicable to the light emitting device package illustrated in FIG. 1.
Figure 4:
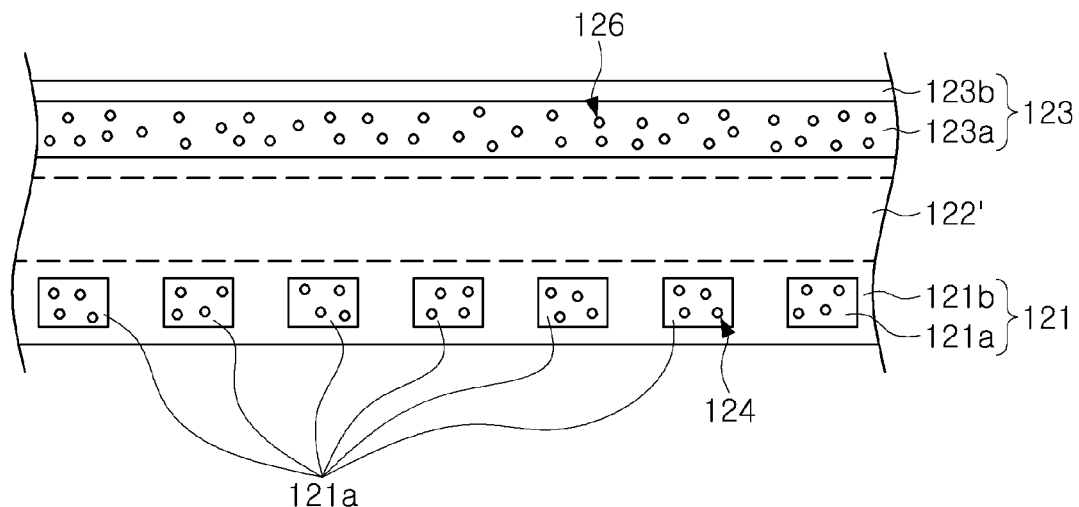
Figure 5:
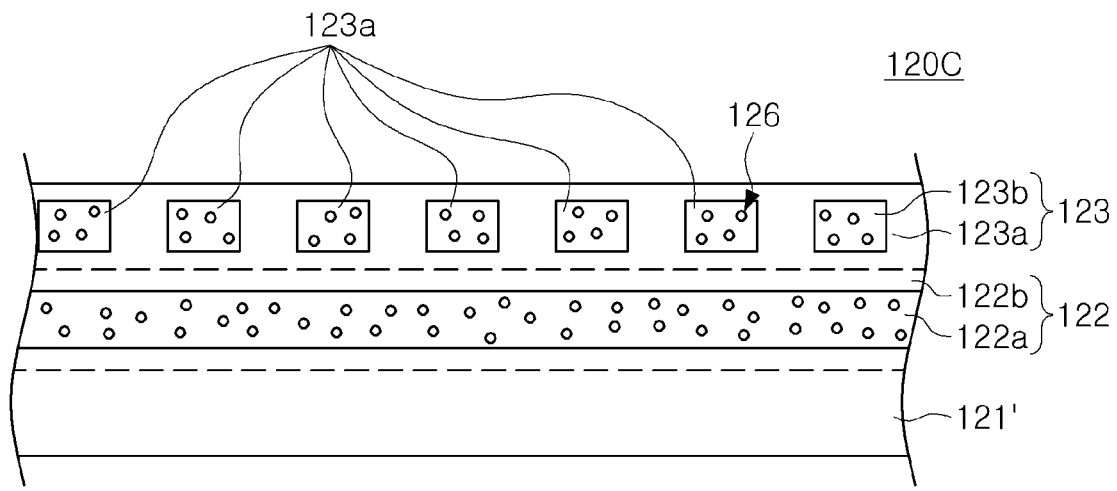

FIGS. 3 through 5 are cross-sectional views illustrating a structure of a wavelength conversion film applicable to the light emitting device package illustrated in FIG. 1.

First, referring to FIG. 3, a wavelength conversion film 120A according to an example embodiment may include a plurality of first to third phosphor layers 121, 122 and 123' sequentially stacked on the substrate 111 of the light emitting device 100. In the example embodiment illustrated in FIG. 3 as compared with the example embodiment shown in FIG. 2, the third phosphor layer 123' positioned at the uppermost layer may omit the wavelength conversion material 126, and only the first and second phosphor layers 121 and 122 may include the wavelength conversion materials 124 and 125, respectively. That is, as illustrated in FIG. 3, the plurality of phosphor structures 121a and 122a may be included only in the first and second phosphor layers 121 and 122.

As discussed above, the plurality of phosphor structures 121a and 122a may have a shape extending in a specific direction, and the phosphor structures 121a and 122a included in the different phosphor layers 121 and 122, respectively, may extend in different directions. In the example embodiment illustrated in FIG. 3, the plurality of first phosphor structures 121a included in the first phosphor layer 121 and the plurality of second phosphor structures 122a included in the second phosphor layer 122 may extend in directions intersecting with each other. A shape of the plurality of phosphor structures 121a and 122a may have the quadrangular rod shape. However, the shapes of the plurality of phosphor structures 121a and 122a may also be modified to have other cross-sectional shapes such as a polygonal rod shape or a circular rod shape, as discussed above.

The plurality of phosphor structures 121a and 122a may include wavelength conversion materials 124 and 125, respectively. Amounts of the wavelength conversion materials 124 and 125 respectively included in the plurality of phosphor structures 121a and 122a may be different. That is, an amount of the wavelength conversion material 124 included in each of the plurality of first phosphor structures 121a may be different, and an amount of the wavelength conversion material 125 included in each of the plurality of second phosphor structures 122a may be different. Here, at least a portion of the plurality of phosphor structures 121a and 122a may omit the wavelength conversion materials 124 and 125. In other words, for example, the first, third, fifth, and seventh phosphor structures 121a in FIG. 3 may omit the wavelength conversion material 124, while the second, fourth, and sixth phosphor structures 121a in FIG. 3 may include the wavelength conversion material 124, etc. In another example, only the phosphor structure 121a that is pointed to by the reference designator 124 in FIG. 3 may include the wavelength conversion material 124, while the remainder of the phosphor structures 121a in FIG. 3 omit the wavelength conversion material 124.

The wavelength conversion materials 124 and 125 respectively included in the plurality of phosphor structures 121a and 122a may have different phosphors or quantum dots. In an example embodiment, the wavelength conversion material 124 included in the plurality of first phosphor structures 121a disposed to be relatively close to the light emitting device 110 may convert light emitted from the light emitting device 110 into light having a relatively long wavelength, and the wavelength conversion material 125 included in the plurality of second phosphor structures 122a may convert light emitted from the light emitting device 110 into light having a relatively short wavelength. For example, the wavelength conversion material 124 included in the plurality of first phosphor structures 121a may emit red light, and the wavelength conversion material 125 included in the plurality of second phosphor structures 122a may emit green light.

A wavelength conversion film 120B according to an example embodiment illustrated in FIG. 4 may have a first phosphor layer 121 including a plurality of first phosphor structures 121a, a third phosphor layer 123 including a plurality of third phosphor structures 123a, and a second phosphor layer 122' disposed between the first and third phosphor layers 121 and 123 and not including a phosphor structure. That is, in the example embodiment illustrated in FIG. 4, the wavelength conversion materials 124 and 126 may be included only in the first and third phosphor layers, respectively.

Like the example embodiment illustrated in FIG. 3, amounts of the wavelength conversion materials 124 and 126 respectively included in the plurality of phosphor structures 121a and 123a may be variously modified. Also, the wavelength conversion material 124 included in the first phosphor layer 121 may emit light having a relatively long wavelength, compared with the wavelength conversion material 126 included in the third phosphor layer 123.

Referring to FIG. 5, a wavelength conversion film 120C according to an example embodiment may include first to third phosphor layers 121', 122, and 123, and the first phosphor layer 121' may omit the wavelength conversion material 124. That is, the wavelength conversion materials 125 and 126 may be included only in the plurality of second and third phosphor structures 122a and 123a respectively provided in the second and third phosphor layers 122 and 123, respectively. Similar to the example embodiments illustrated in FIGS. 3 and 4, the plurality of second and third phosphor structures 122a and 123a may extend in directions intersecting with each other, and a shape thereof may be variously modified into a polygonal rod shape or a circular rod shape, rather than the quadrangular rod. Also, the plurality of second and third phosphor structures 122a and 123a may include phosphors or quantum dots emitting light having different wavelengths, as the wavelength conversion materials 125 and 126.

In the example embodiments illustrated in FIGS. 2 through 5, the plurality of phosphor structures 121a, 122a, and 123a may include the wavelength conversion materials 124, 125, and 126, respectively, and binding resins 124a, 125a, and 126a, respectively, encapsulating the wavelength conversion materials 124, 125, and 126, and spaces between the plurality of phosphor structures 121a, 122a, and 123a may be filled with transparent resins 121b, 122b, and 123b. In an example embodiment, light extraction efficiency of the wavelength conversion films 120, 120A, 120B, and 120C may be increased by adjusting a difference in refractive index between the binding resins 124a, 125a, and 126a encapsulating the respective wavelength conversion materials 124, 125, and 126 and the transparent resins 121b, 122b, and 123b, respectively.

For example, the transparent resins 121b, 122b, and 123b may have a refractive index different from that of the binding resins 124a, 125a, 126a encapsulating the wavelength conversion materials 124, 125, and 126, respectively. In other words, the transparent resin 121b may have a refractive index different from that of the binding resin 124a encapsulating the wavelength conversion material 124, the transparent resin 122b may have a refractive index different from that of the binding resin 125a encapsulating the wavelength conversion material 125, and so on. Alternatively, the transparent resins 121b, 122b, and 123b respectively included in the layers 121, 122, and 123 may have different refractive indices. In the example embodiment of FIG. 3, the third phosphor layer 123' disposed at the uppermost layer in the stacking direction may include a material having a refractive index smaller than that of the binding resins 124a and 125a or that of the transparent resins 121b and 122b, and greater than that of air, to improve light extraction efficiency.

Figure 6:
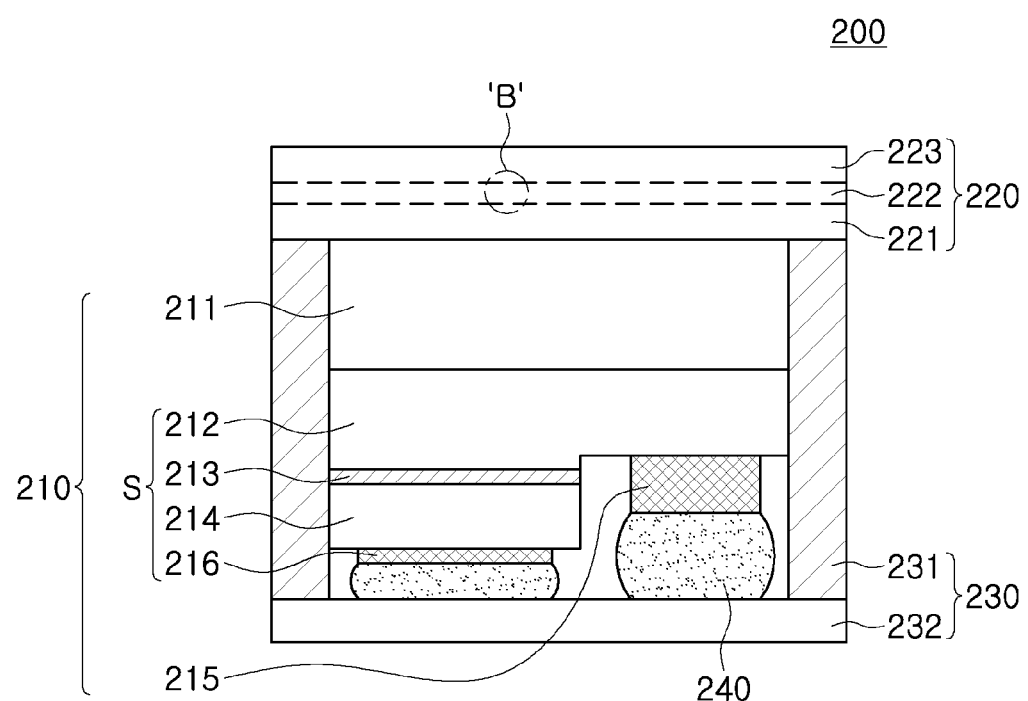
FIG. 6 is a view illustrating a light emitting device package according to an example embodiment.

FIG. 6 is a view illustrating a light emitting device package according to an example embodiment.

Referring to FIG. 6, a light emitting device package 200 according to an example embodiment. The light emitting device package 200 may include a light emitting device 210, a wavelength conversion film 220, a package body 230, and a solder bump 240. The package body 230 may include a reflective wall 231 and a package board 232, and the light emitting device 210 may be mounted on the package board 232. The light emitting device 210 may be electrically connected by the solder bump 240 to a circuit pattern provided on the package board 232.

The light emitting device 210 may include a substrate 211, a light emitting structure S, a first electrode 215, and a second electrode 216, and the light emitting structure S may include a first conductivity-type semiconductor layer 212, an active layer 213, and a second conductivity-type semiconductor layer 214. The first conductivity-type semiconductor layer 212, the active layer 213, and the second conductivity-type semiconductor layer 214 may be configured to be similar to those described above with reference to FIG. 1, and thus repeated description is omitted here.

When an electric signal is applied to the light emitting device 210 through the package board 232, light may be generated according to an electron-hole recombination that electrons and holes supplied from the first conductivity-type semiconductor layer 212 and the second conductivity-type semiconductor layer 214 are combined in the active layer 213. Light generated according to electron-hole recombination may be immediately emitted upwardly through the substrate 211 having translucency and through the wavelength conversion film 220, or may be reflected by the reflective wall 231 or the first and second electrodes 215 and 216 and subsequently emitted through the substrate 211 and the wavelength conversion film 220.

Light generated by electron-hole recombination may be emitted upwardly through the substrate 211 having light-transmittance and through the wavelength conversion film 220 directly, or may be reflected by the reflective wall 231 or the first and second electrodes 215 and 216 and subsequently emitted upwardly through the substrate 211 and the wavelength conversion film 220.

The reflective wall 231 may include a metal oxide having excellent reflectivity such as $TiO_2$, or the like. As illustrated in FIG. 6, an inner surface of the reflective wall 231 may be directly attached to a side surface of the light emitting device 210, but the configuration of the inner surface of the reflective wall 231 is not limited thereto. An upper surface of the reflective wall 231 may be substantially coplanar with an upper surface of the support substrate 211 included in the light emitting device 210, and the wavelength conversion film 220 may be attached to the same plane formed by the upper surfaces of the reflective wall 231 and the support substrate 211.

The wavelength conversion film 220 may include a plurality of phosphor layers 221, 222, and 223, and at least a portion of the phosphor layers 221, 222, and 223 may include a plurality of phosphor structures. The plurality of phosphor structures may be provided in at least two phosphor layers 221, 222, and 223 and stacked on each other. Spaces between the plurality of phosphor structures may be filled with a transparent resin. That is, the transparent resin may be used as a base layer supporting the phosphor layers 221, 222, and 223, and may include a silicon or epoxy resin. Since the spaces between the plurality of phosphor structures are filled with the transparent resin, light extraction efficiency may be enhanced and the light emitting device 210 may be protected.

The plurality of phosphor structures may have at least one of a polygonal shape, a rod shape extending in a specific direction within each of the phosphor layers 221, 222, and 223, and a fiber shape extending in an irregular direction within each of the phosphor layers 221, 222, and 223. The plurality of phosphor structures having a rod shape may be understood through the example embodiments illustrated in FIGS. 2 through 5 and described above, and thus a repeated description is omitted here for concision. Hereinafter, the wavelength conversion film 220 including a phosphor structure having a polygonal shape will be described with reference to FIG. 7.

Figure 7:
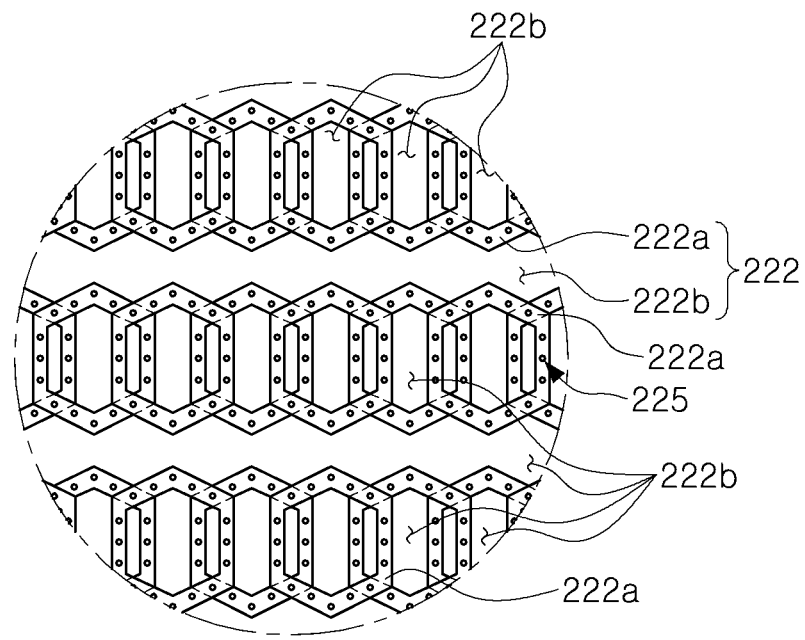
FIG. 7 is an enlarged view of a portion "B" of the light emitting device package illustrated in FIG. 6.

FIG. 7 is an enlarged view of a portion "B" of the light emitting device package illustrated in FIG. 6. It is noted that FIG. 7 shows only the phosphor layer 222 in FIG. 6 by way of example for conciseness and clarity.

Referring to FIG. 7, the wavelength conversion film 220 according to an example embodiment may include a plurality of phosphor structures 222a having a honeycomb shape and a transparent resin 222b filling spaces between the plurality of phosphor structures 222a. The transparent resin 222b may include a silicon or epoxy resin and may support the plurality of phosphor structures 222a included in the plurality of phosphor layers 221, 222, and 223 and stacked on each other.

The plurality of phosphor structures 222a may have a wavelength conversion material and a binding resin encapsulating the wavelength conversion material. At least a portion of the plurality of phosphor structures having a honeycomb shape may be connected to each other or stacked on each other, providing a wavelength conversion film 220 having a three-dimensional (3D) structure in a 3D space. That is the phosphor structures 121a, 122a, 123a included in the phosphor layers 121, 122, and 123 may have a honeycomb structure similar to that of the phosphor structures 222a. Similar to the embodiments described above with reference to FIGS. 2 through 5, the phosphor structures included in the phosphor layers 221, 222, and 223 may include different wavelength conversion materials, and a portion of the phosphor layers 221, 222, and 223 may not omit a wavelength conversion material.

Figure 8:
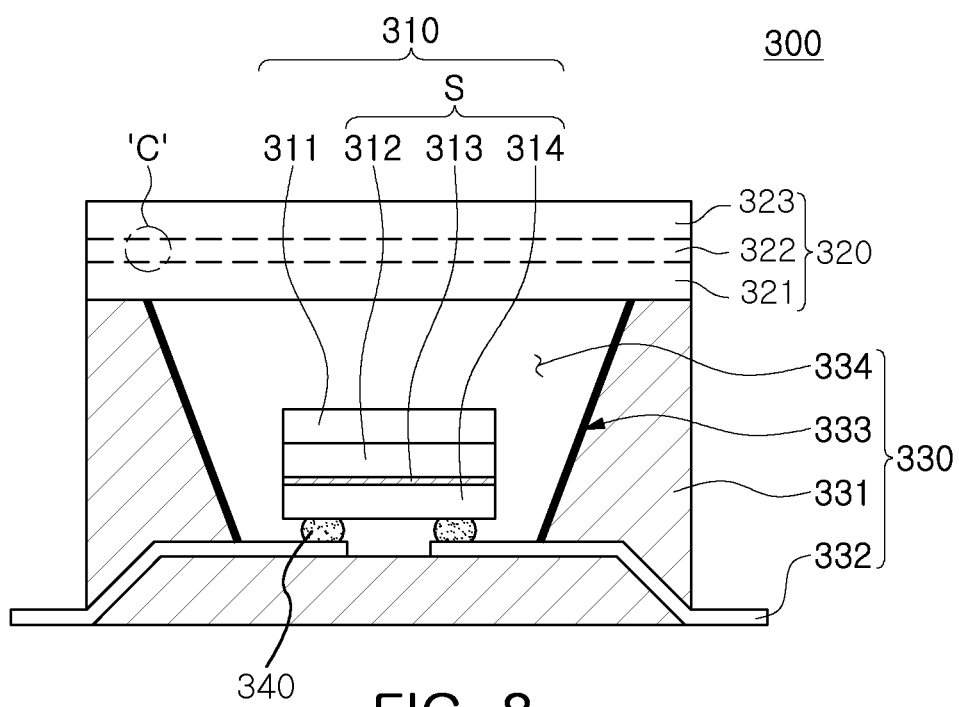
FIG. 8 is a view illustrating a light emitting device package according to an example embodiment.

FIG. 8 is a view illustrating a light emitting device package according to an example embodiment.

Referring to FIG. 8, a light emitting device package 300 according to an example embodiment. The light emitting device package 300 may include a light emitting device 310, a wavelength conversion film 320, a package body 330, and a solder bump 340. The package body 330 may include a body part 331, a lead frame 332, a reflective wall 333, and a mounting space 334 defined by the reflective wall 333 and the lead frame 332. The light emitting device 310 may be mounted on the lead frame 332 exposed in the mounting part 334. The light emitting device 310 may be electrically connected to the lead frame 332 by the solder bump 334. In FIG. 8, it is illustrated that the light emitting device 310 is flip-chip-bonded on the lead frame 332, but alternatively, the light emitting device 310 may be electrically connected to the lead frame 332 through a wire, or the like.

The reflective wall 333 may be a wall adjacent to the light emitting device 310 in the mounting space 334, and may be formed by coating a partial surface of the body part 331 with a material having high reflectivity. The mounting space 334 may be filled with air without performing a separate process or may be filled with an encapsulating resin. In another example embodiment, the mounting space 334 may be provided in a vacuum state.

The wavelength conversion film 320 may be attached to the top of the package body 330. The wavelength conversion film 320 may include a plurality of phosphor layers 321, 322, and 323 sequentially stacked on the light emitting device 310, and the number of phosphor layers 321, 322, and 323 may be variously modified according to example embodiments. At least two of the plurality of phosphor layers 321, 322, and 323 may have a plurality of phosphor structures having a wavelength conversion material. Thus, the wavelength conversion film 320 may have a 3D structure in which a plurality of phosphor structures are disposed in a 3D space.

The plurality of phosphor structures included in the wavelength conversion film 320 may have at least one of a polygonal shape, a rod shape extending in a specific direction within each of the phosphor layers 321, 322, and 323, and a fiber shape extending in an irregular direction within each of the phosphor layers 321, 322, and 323. The plurality of phosphor structures having the rod shape may be understood through the example embodiments illustrated in FIGS. 2 through 5, and the plurality of phosphor structures having the polygonal shape may be understood through the example embodiment illustrated in FIG. 7. Hereinafter, a phosphor structure having the fiber shape will be described with reference to FIG. 9.

Figure 9:
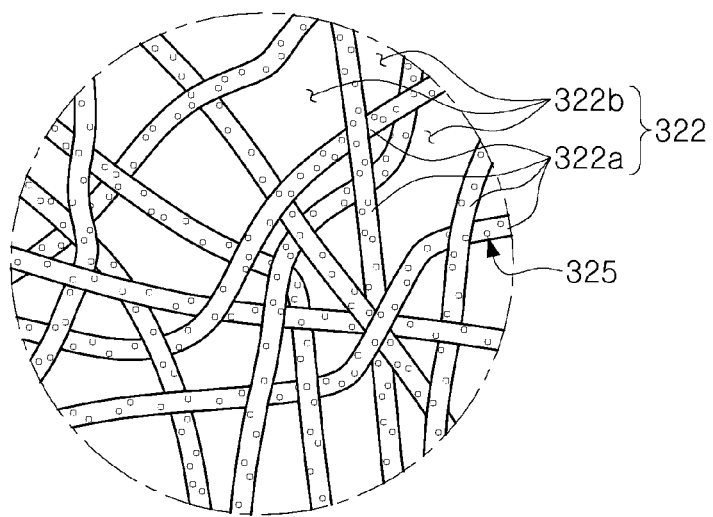
FIG. 9 is an enlarged view of a portion "C" of the light emitting device package illustrated in FIG. 8.

FIG. 9 is an enlarged view of a portion "C" of the light emitting device package illustrated in FIG. 8. It is noted that FIG. 9 shows only the phosphor layer 322 in FIG. 8 by way of example for conciseness and clarity.

Referring to FIG. 9, the wavelength conversion film 320 according to an example embodiment may include a plurality of phosphor structures 322a having a fiber shape and a transparent resin 322b filling spaces between the plurality of phosphor structures 322a. Like in the example embodiment illustrated in FIG. 7, the transparent resin 322b may include a silicon or epoxy resin and may support the plurality of phosphor structures 322a included in the phosphor layer 322. It is noted that a similar structure of the phosphor structures may be provided for the remaining phosphor structures of the plurality of phosphor layers 321, 322, and 323, respectively, and the plurality of phosphor layers 321, 322, and 323 may be stacked on each other.

The plurality of phosphor structures 322a may have a wavelength conversion material and a binding resin encapsulating the wavelength conversion material. As illustrated in FIG. 9, the plurality of phosphor structures 322a having a wavelength conversion material may intersect with each other and cross each other, having a 3D structure in a 3D space. That is, the plurality of phosphor structures having the fiber shape may be understood as having a shape extending in a random direction within the wavelength conversion film 320. The plurality of phosphor structures 322a having the fiber shape may have a diameter of about 10 µm or greater sufficient for including a wavelength conversion material, and may cross each other to form a 3D structure even within a single phosphor layer 321, 322, or 323.

The example embodiments described above with reference to FIGS. 1 through 9 may be applied in a crossing manner. That is, the wavelength conversion films 220 and 320 having the phosphor structures 222a and 322a having the honeycomb and fiber shape, respectively, described above with reference to FIGS. 7 and 9 may be applied to the light emitting device package 100 illustrated in FIG. 1, and the wavelength conversion films 120, 120A, 120B, and 120C illustrated in FIGS. 2 through 5 may be applied to the light emitting device packages 200 and 300 illustrated in FIGS. 6 and 8. Also, the wavelength conversion films 220 and 320 described above with reference to FIGS. 7 and 9 may be manufactured by the 3D printing technique like the wavelength conversion films 120, 120A, 120B, and 120C described above with reference to FIGS. 2 through 5.

Figure 10:
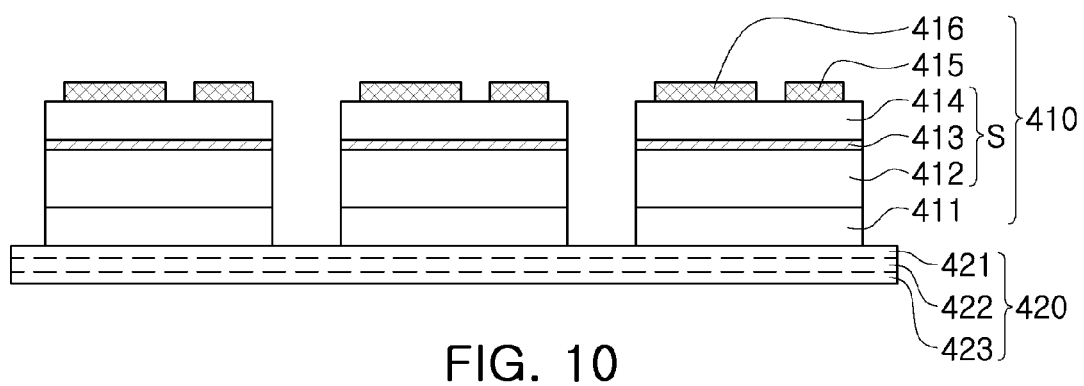
FIGS. 10 through 12 are views illustrating a method of manufacturing a light emitting device package according to an example embodiment.
Figure 11:
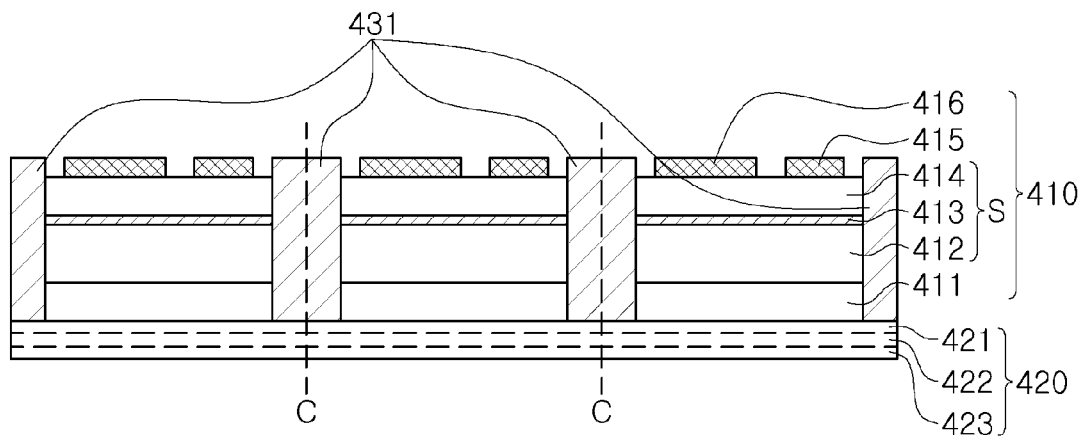
Figure 12:
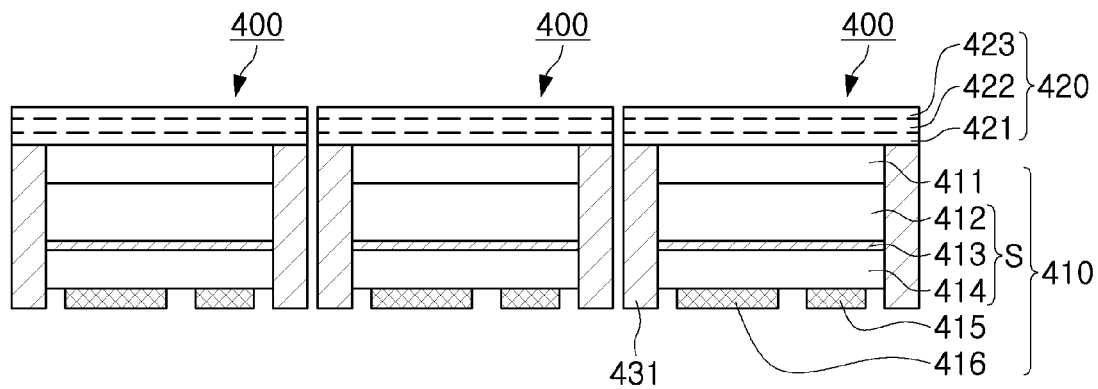

FIGS. 10 through 12 are views illustrating a method of manufacturing a light emitting device package according to an example embodiment.

Referring to FIG. 10, a method of manufacturing a light emitting device package may begin by disposing at least one light emitting device 410 on a wavelength conversion film 420. The wavelength conversion film 420 may include a plurality of phosphor layers 421, 422, and 423 stacked on each other, and the 3D printing technique described above with reference to FIG. 2 may be used in the process of manufacturing the wavelength conversion film 420. At least two of the plurality of phosphor layers 421, 422, and 423 may include a plurality of phosphor structures having various shapes, and thus, the plurality of phosphor structures may be stacked within the wavelength conversion film 420, forming a 3D structure, as described above.

The light emitting device 410 may include a substrate 411, a light emitting structure S, and a first electrode 415 and a second electrode 416. The light emitting structure S may include a first conductivity-type semiconductor layer 412, an active layer 413, and a second conductivity-type semiconductor layer 414. In an example embodiment, the second electrode 416 may be directly disposed on the second conductivity-type semiconductor layer 414 such that the second electrode 416 is in ohmic contact with the second conductivity-type semiconductor layer 414, and the first electrode 416 may be electrically connected to the first conductivity-type semiconductor layer 415 through a conductive via, or the like, provided within the light emitting device 410.

The light emitting device 410 may be disposed on one surface of the first phosphor layer 421. That is, at least a portion of the first phosphor layer 421 may be attached to the light emitting device 410. In an example embodiment, the first phosphor layer 421 disposed to be close to the light emitting device 410 may include a wavelength conversion material emitting light having a wavelength longer than those of the second and third phosphor layers 422 and 423. In another example embodiment, the third phosphor layer 423 disposed to be relatively away from the light emitting device 410 may omit a wavelength conversion material and may include a material having a refractive index greater than that of air and smaller than that of a binding resin or a transparent resin included in the first and second phosphor layers 421 and 422.

Referring to FIG. 11, a reflective wall 431 may be formed in a space between the light emitting devices 410. In order to form the reflective wall 431, a white molding compound containing a filler may be injected into a space between the light emitting devices 410 through a dispenser, or the like, and cured. The filler may include one or more materials selected from the group consisting of $SiO_2$, $TiO_2$, and $Al_2O_3$, and may be contained in the form of nano-scale particles in the white molding compound. The white molding compound may include thermosetting resins having high heat resistance or silicon resins, or may include thermoplastic resins containing white pigment, a filler, a curer, a releasing agent, an anti-oxidant, an adhesive strength improver, and the like.

After the reflective wall 431 is formed, the reflective wall 411 may be cut along cutting lines C between the light emitting devices 410 to form light emitting device packages 400. Referring to FIG. 12, the light emitting device packages 400 may each include the wavelength conversion film 420, the reflective wall 431, and the light emitting device 410. Light generated by the active layer 413 of the light emitting device 410 may be directly emitted upwardly from the light emitting device 410 through the substrate 411 or may be reflected through the reflective wall 431 and the first and second electrodes 415 and 416 and emitted upwardly from the light emitting device 410. Thus, the wavelength conversion film 420 may be positioned in a movement path of light emitted by the light emitting device. 410.

FIGS. 13 through 18 are views illustrating a semiconductor light emitting device applicable to a light emitting device package according to an example embodiment.

Figure 13:
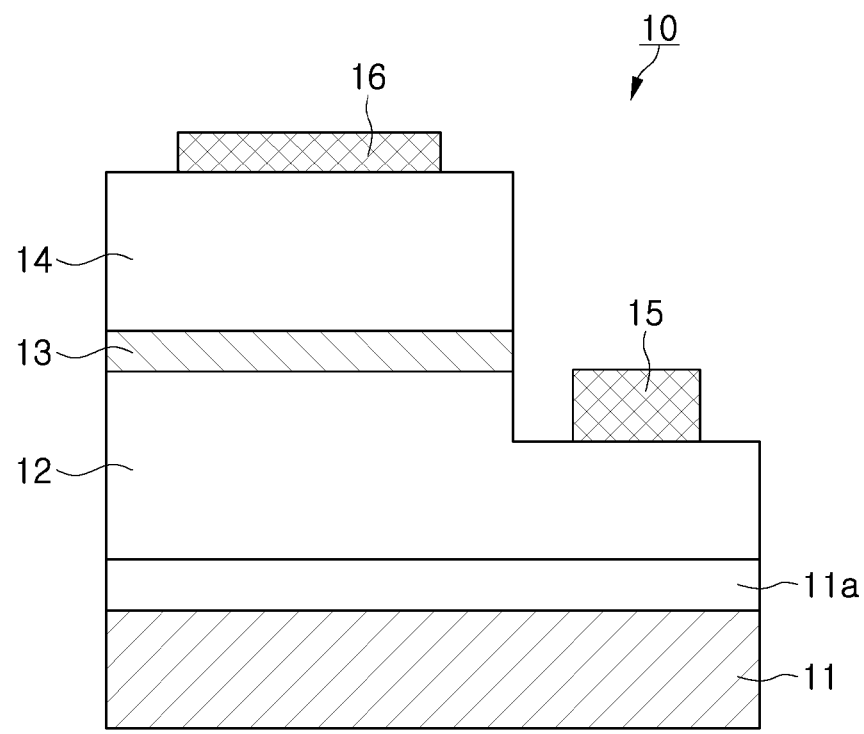
FIGS. 13 through 18 are views illustrating a semiconductor light emitting device applicable to a light emitting device package according to an example embodiment.

Referring to FIG. 13, a light emitting device according to an example embodiment may include a substrate 11, a first conductivity-type semiconductor layer 12, an active layer 13, and a second conductivity-type semiconductor layer 14. Also, a first electrode 15 may be formed on the first conductivity-type semiconductor layer 12, and a second electrode 16 may be formed on the second conductivity-type semiconductor layer 14. An ohmic contact layer may be further provided selectively between the second electrode 16 and the second conductive type semiconductor layer 14.

The substrate 11 may be at least one of insulating, conductive, and semiconductor substrates according to various example embodiments. The substrate 11 may be formed of, for example, sapphire, SiC, Si, $MgAl_2O_4$, MgO, $LiAlO_2$, $LiGaO_2$, or GaN. For an epitaxial growth of a GaN material, a GaN substrate, a homogeneous substrate, may be selected as a substrate 11, and as a heterogeneous substrate, a sapphire substrate or a silicon carbide (SiC) substrate may be used. When a heterogeneous substrate is used, a defect such as dislocation, or the like, may be increased due to a difference in lattice constant between a substrate material and a thin film material, bowing (or bending) may occur when a temperature is changed due to a difference in a coefficient of thermal expansion between the substrate material and the thin film material, which may cause cracks of the thin film. In order to prevent such cracks, a buffer layer 11a may be disposed between the substrate 11 and the GaN-based first conductivity-type semiconductor layer 12.

When the first conductivity-type semiconductor layer 12 including GaN is grown on a heterogeneous substrate, a dislocation density may increase due to a mismatch in lattice constant between the substrate material and the thin film material, and cracks and bowing may occur due to a difference in a coefficient of thermal expansion therebetween. In order to prevent such dislocation and cracks, the buffer layer 11a may be disposed between the substrate 11 and the first conductivity-type semiconductor layer 12. The buffer layer 11a may adjust a degree of bowing of the substrate when the active layer 13 is grown, to reduce a wavelength dispersion of a wafer.

The buffer layer 11a may be formed of $Al_xIn_yGa_{1-x-y}N$, where $0 \le x \le 1$ and $0 \le y \le 1$, and, in particular, GaN, AlN, AlGaN, InGaN, or InGaNAlN may be used, and in some example embodiments, a material such as $ZrB_2$, $HfB_2$, ZrN, HfN, or TiN may also be used. Also, the buffer layer 11a may be formed by combining a plurality of layers or by gradually changing a composition.

The silicon substrate has a significant difference in a coefficient of thermal expansion from GaN. Thus, in a case in which a GaN-based thin film is grown on the silicon substrate, when the GaN thin film is grown and subsequently cooled to room temperature, tensile stress is applied to the GaN thin film due to a difference in a coefficient of thermal expansion between the silicon substrate and the GaN thin film, resulting in generation of cracks. In order to prevent generation of cracks, tensile stress may be compensated using a method of growing a thin film such that compressive stress is applied to the thin film. Also, silicon (Si) has a high possibility of generating a defect due to a difference in lattice constant from GaN. In the case of using the silicon substrate, it is advantageous to control stress for restraining bowing, as well as defect control, and thus, a buffer layer 11a having a composite structure may be used.

In order to form the buffer layer 11a, first, an AlN layer may be formed on the substrate 11. In this case, a material not including gallium (Ga) may be used in order to prevent a reaction between silicon (Si) and gallium (Ga). The AlN layer is grown at a temperature ranging from 400° C. to 1,300° C. by using an aluminum (Al) source and a nitrogen (N) source. Here, an AlGaN intermediate layer may be inserted into the center of GaN between the plurality of AlN layers to control stress to form the buffer layer 11a having a composite structure.

In order to prevent a reaction between silicon (Si) and gallium (Ga), a material not including gallium may be used, and a material such as SiC, or the like, as well as AlN, may also be used. The AlN layer may be grown at a temperature ranging from 400° C. to 1300° C. using an Al source and an N source, and in some example embodiments, an AlGaN intermediate layer may be inserted in the middle of GaN between a plurality of AlN layers in order to control stress.

The first and second conductivity-type semiconductor layers 12 and 14 may be formed of semiconductors respectively doped with n-type and p-type impurities. However, the present inventive concept is not limited thereto, and the first and second conductivity-type semiconductor layers 12 and 14 may be formed of p-type and n-type semiconductors layers, respectively. For example, the first and second conductivity-type semiconductor layers 12 and 14 may be formed of a Group III nitride semiconductor, for example, a material having a composition of $Al_xIn_yGa_{1-x-y}N$, where $0 \le x \le 1$, $0 \le y \le 1$, and $0 \le x+y \le 1$. However, the material of the first and second conductivity-type semiconductor layers 12 and 14 is not limited thereto, and a material such as an AlGaInP-based semiconductor or an AlGaAs-based semiconductor may also be used.

The first and second conductivity-type semiconductor layers 12 and 14 may have a single layer structure, or, alternatively, the first and second conductivity-type semiconductor layers 12 and 14 may have a multilayer structure including layers having different compositions and thicknesses. For example, the first and second conductivity-type semiconductor layers 12 and 14 may have a carrier injection layer for improving electron and hole injection efficiency, or may have various types of superlattice structures, respectively.

The first conductivity-type semiconductor layer 12 may further include a current spreading layer in a region adjacent to the active layer 13. The current spreading layer may have a structure in which a plurality of $In_xAl_yGa_{(1-x-y)}N$ layers having different compositions or different impurity contents are iteratively stacked, or may have an insulating material layer partially formed therein.

The second conductivity-type semiconductor layer 14 may further include an electron blocking layer in a region adjacent to the active layer 13. The electron blocking layer may have a structure in which a plurality of $In_xAl_yGa_{(1-x-y)}N$ layers having different compositions are stacked or may have one or more layers including $Al_yGa_{(1-y)}N$. The electron blocking layer has a band gap wider than that of the active layer 13, thus preventing electrons from being transferred to the second conductivity-type semiconductor layer 14.

The first and second conductivity-type semiconductor layers 12 and 14 and the active layer 13 may be formed by using metal-organic chemical vapor deposition (MOCVD). In order to form the first and second conductivity-type semiconductor layers 12 and 14 and the active layer 13, an organic metal compound gas (e.g., trimethyl gallium (TMG) or trimethyl aluminum (TMA)) and a nitrogen-containing gas (ammonia ($NH_3$), or the like) are supplied as reaction gases to a reaction container in which the growth substrate 11 is installed, the substrate 11 is maintained at a high temperature ranging from about 900° C. to about 1,100° C., and while a gallium nitride-based compound semiconductor is being grown, an impurity gas may be supplied to stack the gallium nitride-based compound semiconductor as an undoped n-type or p-type semiconductor. Silicon (Si) is a well known n-type impurity. P-type impurities include zinc (Zn), cadmium (Cd), beryllium (Be), magnesium (Mg), calcium (Ca), and barium (Ba), and among them, magnesium (Mg) and zinc (Zn) are used.

Also, the active layer 13 disposed between the first and second conductivity-type semiconductor layers 12 and 14 may have a multi-quantum well (MQW) structure in which quantum well layers and quantum barrier layers are alternately stacked. For example, in the case of a nitride semiconductor, a GaN/InGaN structure may be used, or a single quantum well (SQW) structure may also be used. The first or second electrodes 15 or 16 may be formed of a material such as silver (Ag), nickel (Ni), aluminum (Al), rhodium (Rh), palladium (Pd), iridium (Jr), ruthenium (Ru), magnesium (Mg), zinc (Zn), platinum (Pt), or gold (Au). The light emitting device 10 illustrated in FIG. 13 may have an epi-up structure, and thus, the light emitting device 10 may be connected to a circuit pattern included in a circuit board through a wire, or the like, within a light emitting device package.

Figure 14:
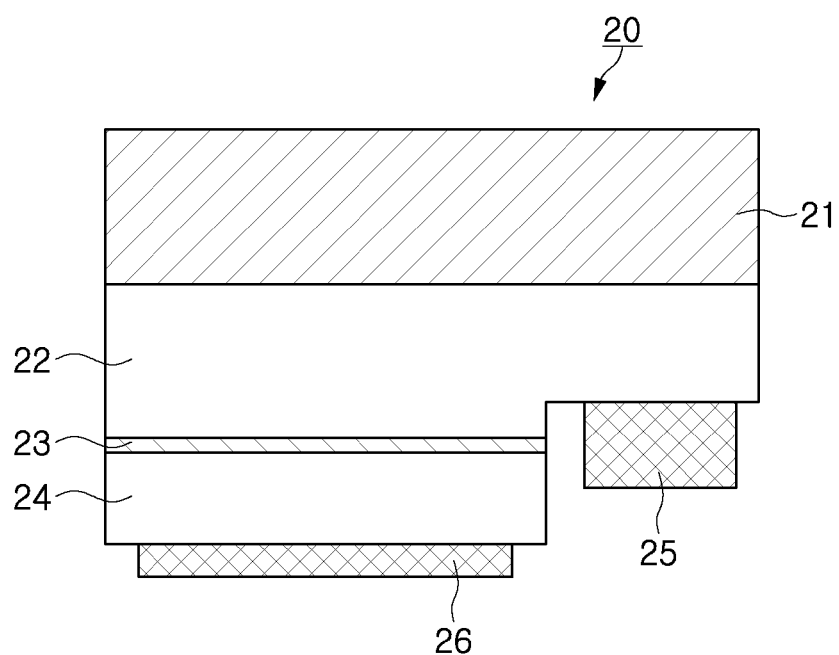

Referring to FIG. 14, a light emitting device 20 according to an example embodiment may include a support substrate 21, first and second conductivity-type semiconductor layers 22 and 24, an active layer 23, and first and second electrodes 25 and 26. The light emitting device 20 according to an example embodiment illustrated in FIG. 14 may be attached to a circuit board of a light emitting device package through flip-chip bonding. Since light generated by the active layer 23 needs to be emitted upwardly, the support substrate 21 may be formed of a material having translucency.

Also, in order to reflect light generated by the active layer 23 and moving downwardly, the second electrode 26 may be formed of a material having excellent electric conductivity and reflectivity. In an example embodiment, the second electrode 26 may be formed of at least one of silver (Ag), nickel (Ni), aluminum (Al), rhodium (Rh), palladium (Pd), iridium (Jr), ruthenium (Ru), magnesium (Mg), zinc (Zn), platinum (Pt), and gold (Au).

The light emitting device 20 illustrated in FIG. 14 may be attached to a circuit board of a light emitting device package through flip-chip bonding, and thus, the light emitting device 20 may be included in the light emitting device package 100, 200, and 300 according to the example embodiments illustrated in FIGS. 1, 6, and 8. That is, the wavelength conversion film 120, 220, or 320 may be attached to an upper surface of the support substrate 21.

Figure 15:
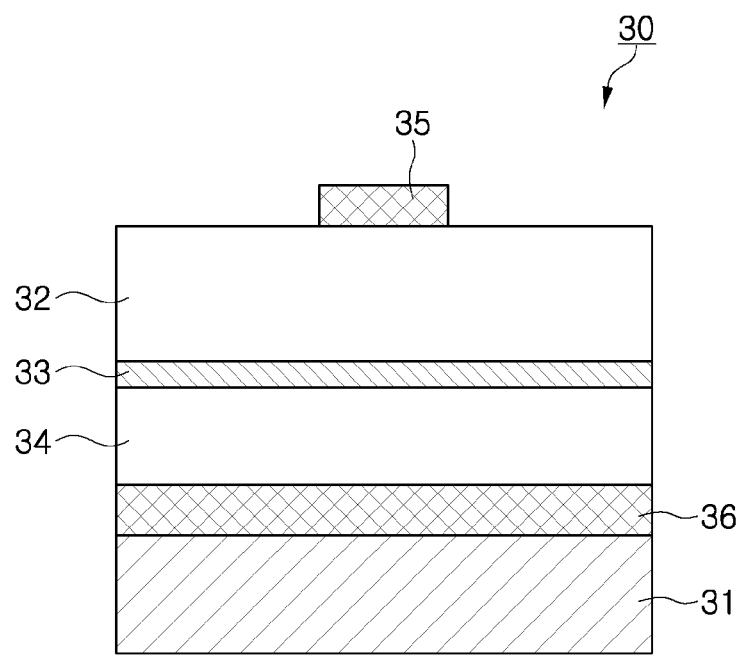

Referring to FIG. 15, a light emitting device 30 according to an example embodiment is illustrated. The light emitting device 30 according to an example embodiment may include a first conductivity-type semiconductor layer 32, an active layer 33, a second conductivity-type semiconductor layer 34, a first electrode 35 attached to the first conductivity-type semiconductor layer 32, and a second electrode 36 attached to the second conductivity-type semiconductor layer 34. A conductive substrate 31 may be disposed on a lower surface of the second electrode 36, and the conductive substrate 31 may be directly mounted on a circuit board for constituting a light emitting device package. Within a light emitting device package, the conductive substrate 31 may be directly mounted on a circuit board, and the first electrode 35 may be electrically connected to a circuit pattern of the circuit board through a wire, or the like.

Like the semiconductor light emitting devices 10 and 20 described above, the first conductivity-type semiconductor layer 32 and the second conductivity-type semiconductor layer 34 may include an n-type nitride semiconductor and a p-type nitride semiconductor, respectively. The active layer 33 disposed between the first and second conductivity-type semiconductor layers 32 and 34 may have an MQW structure in which nitride semiconductor layers having different compositions are alternately stacked, and may also selectively have an SQW structure.

The first electrode 35 may be disposed on an upper surface of the first conductivity-type semiconductor layer 32, and the second electrode 36 may be disposed on a lower surface of the second conductivity-type semiconductor layer 34. Light generated by the active layer 33 of the light emitting device 30 illustrated in FIG. 15 according to electron-hole recombination may be emitted to an upper surface of the first conductivity-type semiconductor layer 32. Thus, in order to reflect light generated by the active layer 33 in the direction of the upper surface of the first conductivity-type semiconductor layer 32, the second electrode 36 may be formed of a material having high reflectivity. The second electrode 36 may include at least one of Ag, Al, Ni, Cr, Cu, Au, Pd, Pt, Sn, Ti, W, Rh, Ir, Ru, Mg, Zn, or alloys thereof.

Figure 16:
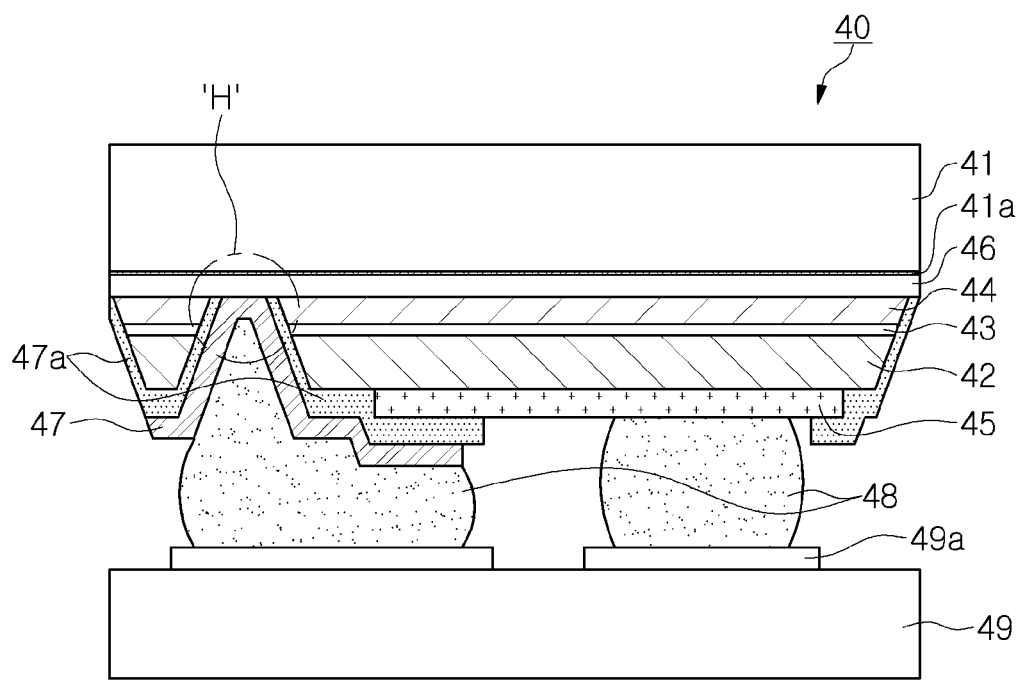

Referring to FIG. 16, a light emitting device 40 according to an example embodiment includes a first conductivity-type semiconductor layer 42, a second conductivity-type semiconductor layer 44, an active layer 43 positioned between the first and second conductivity-type semiconductor layers 42 and 44, and first and second electrodes 45 and 46 respectively connected to the first and second conductivity-type semiconductor layers 42 and 44. In the present example embodiment, the first and second electrodes 45 and 46 may be disposed on surfaces opposing each other with the first and second conductivity-type semiconductor layers 42 and 44 and the active layer 43. A support substrate 41 may be attached to the second electrode 46 by a bonding layer 41a, supporting the light emitting device 40.

The light emitting device 40 according to the present example embodiment may further include a connecting electrode 47 as an electrode element related to the second electrode 46. The connecting electrode 47 may be connected to the second electrode 46 through a through hole H formed by removing at least portions of the first and second conductivity-type semiconductor layers 42 and 44 and the active layer 43. At least a portion of the second electrode 46 may be exposed through the through hole H, and the second electrode 46 and the connecting electrode 47 may be connected in the exposed region. The connecting electrode 47 may be formed along a side wall of the through hole H, and an insulating layer 47a may be provided between the connecting electrode 47 and the side wall of the through hole H in order to prevent the connecting electrode 47 from being connected to the active layer 43 and the first conductivity-type semiconductor layer 42.

The aforementioned electrode structure may be more effectively applied in a configuration in which the first and second conductivity-type semiconductor layers 42 and 44 are n-type and p-type nitride semiconductor layers, respectively. The p-type nitride semiconductor layer may have contact resistance greater than that of the n-type nitride semiconductor layer, and thus, it may be difficult to obtain ohmic contact. However, in the example embodiment illustrated in FIG. 16, since the second electrode 46 is disposed on the entire surface of the support substrate 41, a contact area between the second conductivity-type semiconductor layer 44 and the second electrode 46 may be sufficiently secured, whereby ohmic contact with the p-type nitride semiconductor layer may be secured.

The light emitting device 40 according to the example embodiment illustrated in FIG. 16 may have a flip-chip structure in which light is emitted in a direction toward the support substrate 41. That is, the first electrode 45 and the connecting electrode 47 may be electrically connected to a circuit pattern 49a of a circuit board 49 through respective solder bumps 48, or the like. Thus, the first electrode 45 may include an electrode material having high reflectivity as well as ohmic contact characteristics. The second electrode 46 and the support substrate 41 may have high translucency. For example, the first electrode 45 may include a material such as Ag, Ni, Al, Rh, Pd, Jr, Ru, Mg, Zn, Pt, or Au. The second electrode 46 may be a translucent (or light-transmissive) metal such as Ni/Au, a transparent conductive oxide such as indium tin oxide (ITO), or a nitride. The support substrate 41 may be a glass substrate or a substrate formed of a translucent polymer resin.

The connecting electrode 47 may be electrically insulated from the first conductivity-type semiconductor layer 42 and the active layer 43 through the insulating layer 47a. As illustrated in FIG. 16, the insulating layer 47a may be formed along a side wall of the through hole H. Also, the insulating layer 47a may be formed on side surfaces of the first and second conductivity-type semiconductor layers 42 and 44 and the active layer 43 and provided as a passivation layer for the light emitting device 10. The insulating layer 47a may include a silicon oxide or a silicon nitride.

Figure 17:
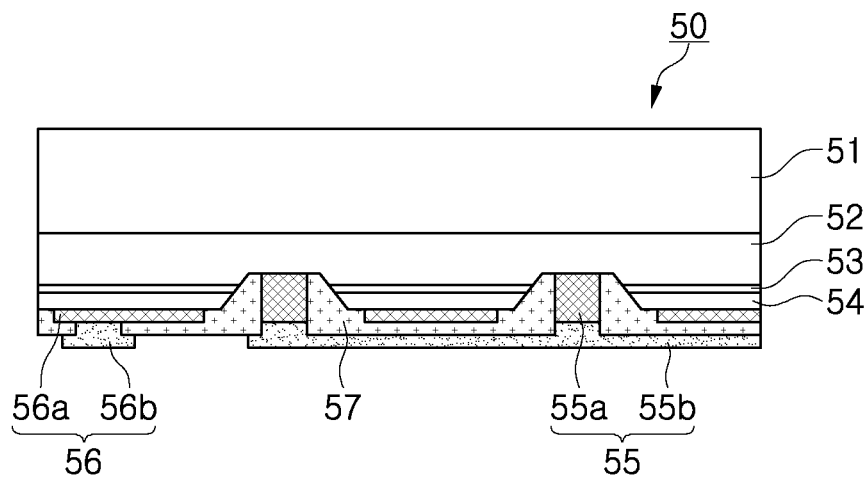

Referring to FIG. 17, a light emitting device 50 according to an example embodiment is disclosed. The light emitting device 50 may include a first conductivity-type semiconductor layer 52, an active layer 53, a second conductivity-type semiconductor layer 54, and first and second electrodes 55 and 56 sequentially stacked on one surface of a substrate 51. Also, the light emitting device 50 may include an insulating part 57. The first electrode 55 may include a contact electrode 55a and a connecting electrode 55b, and the second electrode 56 may include a contact electrode 56a and a connecting electrode 56b, and partial regions of the contact electrodes 55a and 56a exposed by the insulating part 57 may be connected to the connecting electrodes 55b and 56b, respectively.

The first contact electrode 55a may be provided as a conductive via connected to the first conductivity-type semiconductor layer 52 through the second conductivity-type semiconductor layer 54 and the active layer 53. The second contact electrode 56a may be connected to the second conductivity-type semiconductor layer 54. A plurality of conductive vias may be formed in a single light emitting device region.

The first and second contact electrodes 55a and 56a may be formed by depositing a conductive ohmic material on the first and second conductivity-type semiconductor layers 52 and 54. The first and second contact electrodes 55a and 56a may include at least one of Ag, Al, Ni, Cr, Cu, Au, Pd, Pt, Sn, Ti, W, Rh, Jr, Ru, Mg, Zn, and alloys thereof. Also, the second contact electrode 56a may serve to reflect light generated by the active layer 53 and emitted downwardly from the light emitting device 50.

The insulating part 57 may have open regions exposing at least portions of the first and second contact electrodes 55a and 56a, and the first and second connecting electrodes 55b and 56b may be respectively connected to the first and second contact electrodes 55a and 56a. The insulating part 57 may be deposited to have a thickness of about 0.01 μm to about 3 μm at a temperature of about 500° C. or lower through a $SiO_2$ and/or SiN chemical vapor deposition (CVD) process. The first and second electrodes 55 and 56 may be mounted in a flip-chip form on the light emitting device package.

The first and second electrodes 55 and 56 may be electrically separated from each other by the insulating part 57. Any material may be used as a material of the insulating part 57 as long as it has electrically insulating properties, but advantageously, a material having a low light absorption rate is used in order to prevent a degradation of light extraction efficiency. For example, a silicon oxide or a silicon nitride such as $SiO_2$, $SiO_xN_y$, or $Si_xN_y$ may be used. In some example embodiments, a light reflective filler may be dispersed in a light-transmissive material to form a light reflective structure.

The substrate 51 may have first and second surfaces opposing each other, and an irregular pattern may be formed on at least one of the first and second surfaces. The irregular pattern formed on one surface of the substrate 51 may be formed by etching a portion of the substrate 51 so that the irregular pattern may be formed of the same material as that of the substrate 51, or may be formed of a material different from that of the substrate 51. For example, when the irregular pattern is formed on an interface between the substrate and the first conductivity-type semiconductor layer 52, paths of light emitted from the active layer 53 may be varied, and thus, a percentage of light absorbed in the interior of the semiconductor layers may be reduced and a percentage of light scattering may be increased, increasing light extraction efficiency. Also, a buffer layer may be provided between the substrate 51 and the first conductivity-type semiconductor layer 52.

Figure 18:
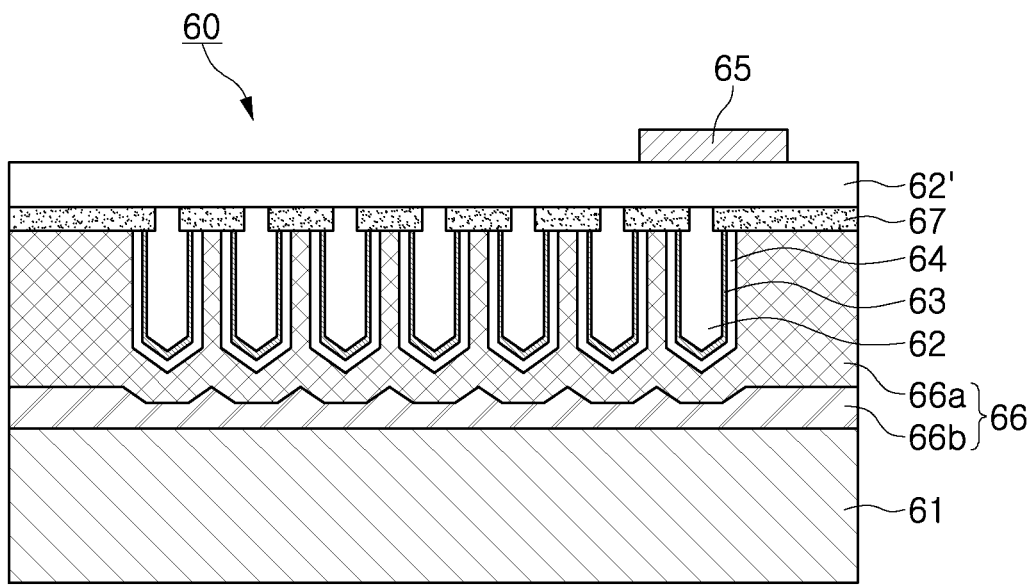

Referring to FIG. 18, a light emitting device 60 according to an example embodiment may be a light emitting device having light emitting nanostructures. The light emitting device 60 may include a base layer 62' including a first conductivity-type semiconductor material, a mask layer 67 prepared on the base layer 62' and providing a plurality of openings, and nanocores 62 formed in openings provided by the mask layer 67. An active layer 63 and a second conductivity-type semiconductor layer 64 may be provided on each nanocore 62. Each nanocore 62, active layer 63, and second conductivity-type semiconductor layer 64 may provide a light emitting nanostructure.

A second contact electrode 66a may be provided on the second conductivity-type semiconductor layer 64, and a second connecting electrode 66b may be provided on one surface of the second contact electrode 66a. The second contact electrode 66a and the second connecting electrode 66b may be provided as a second electrode 66. A support substrate 61 may be attached to one surface of the second electrode 66, and the support substrate 61 may be a conductive or an insulating substrate. When the support substrate 61 has conductivity, the support substrate 61 may be directly mounted on a circuit board of a light emitting device package. A first electrode 65 may be provided on the base layer 62' including a first conductivity-type semiconductor material. The first electrode 65 may be connected to a circuit pattern included in a circuit board of a light emitting device package by a wire, or the like.

Figure 19A:
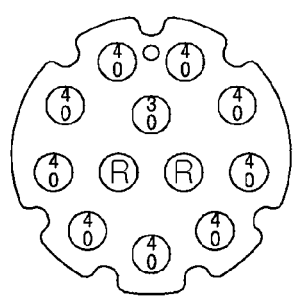
FIGS. 19A and 19B are views schematically illustrating a white light source module including a light emitting device package according to an example embodiment.
Figure 19B:
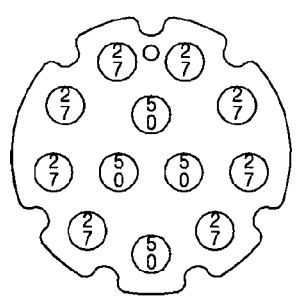
Figure 20:
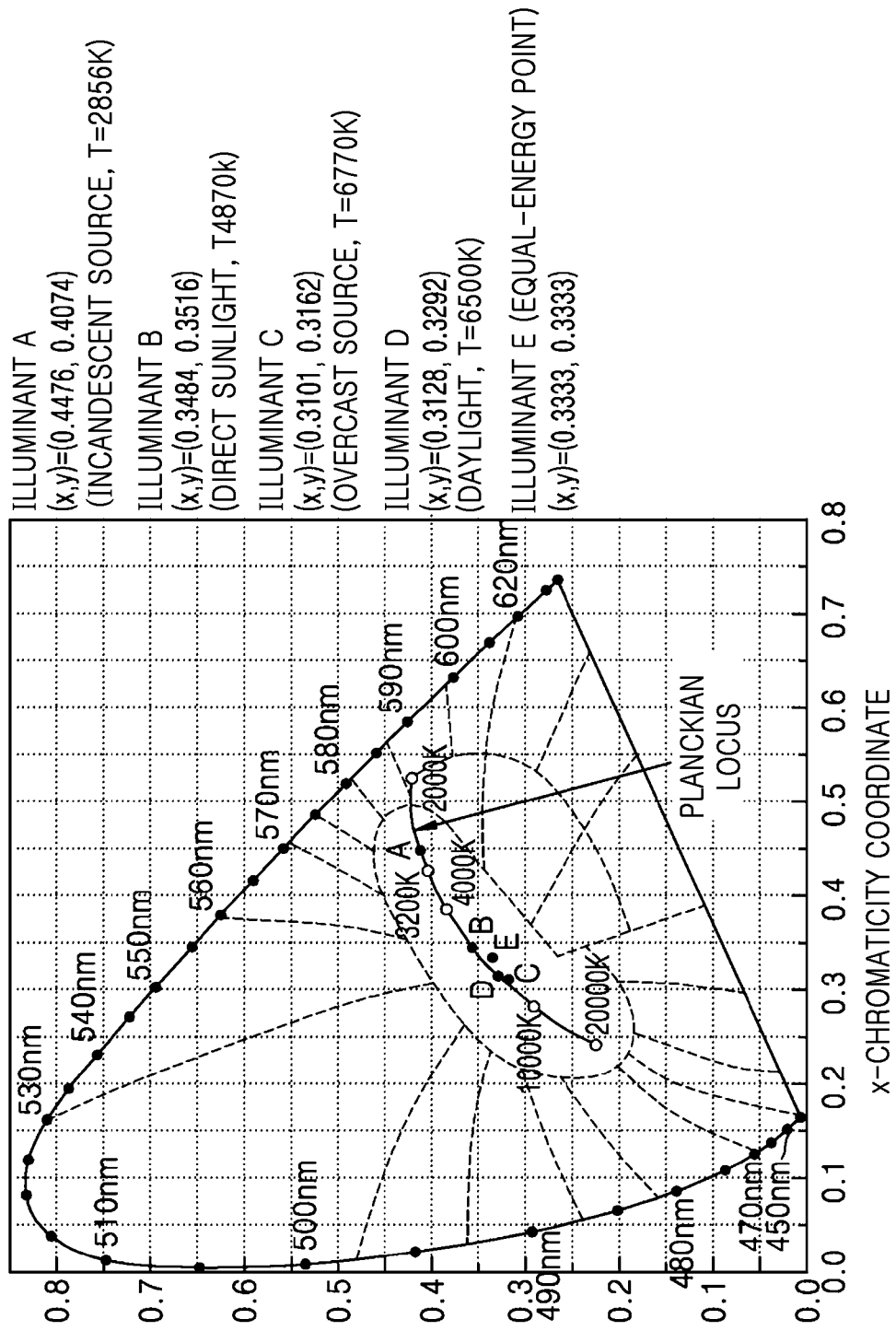
FIG. 20 is a CIE 1931 color space chromaticity diagram illustrating an operation of the white light source module illustrated in FIGS. 19A and 19B.

FIGS. 19A and 19B are views schematically illustrating a white light source module including a light emitting device package according to an example embodiment. FIG. 20 is a CIE 1931 color space chromaticity diagram illustrating an operation of the white light source module illustrated in FIGS. 19A and 19B.

Light source modules illustrated in FIGS. 19A and 19B may include a plurality of light emitting device packages mounted on a circuit board. A plurality of light emitting device packages mounted on a single white light source module may be configured as homogenous packages generating light having the same wavelength, or, as in the present example embodiment, the plurality of light emitting device packages mounted on a single white light source module may also be configured as heterogeneous packages generating light having different wavelengths.

Referring to FIG. 19A, a white light source module may be configured by combining white light emitting device packages 40 and 30 respectively having color temperatures of 4000K and 3000K and a red light emitting device package (indicated as "R"). For example, FIG. 19A shows white light emitting device packages 40 arrange around the outer perimeter and a white light emitting device package 30 provided within the perimeter. However, this is only an example and the arrangement may vary. The white light source module may provide white light having a color temperature that may be adjusted to range from 3000K to 4000K and having a color rendering index (CRI) Ra ranging from 85 to 100.

In another example embodiment, a white light source module may include only white light emitting device packages in which a portion of the packages may emit white light having a different color temperature. For example, as illustrated in FIG. 19B, a white light emitting device package 27 having a color temperature of 2700K and a white light emitting device package 50 having a color temperature of 5000K may be combined to provide white light having a color temperature that may be adjusted to range from 2700K to 5000K and having a CRI Ra ranging from 85 to 99. Here, the amount of light emitting device packages of each color temperature may vary mainly depending on a basically set color temperature value. For example, in a case of a lighting device in which a basically set value is a color temperature of about 4000K, the amount of packages corresponding to 4000K may be greater than that of a color temperature of 3000K or the amount of red light emitting device packages.

In this manner, the heterogeneous light emitting device packages may be configured to include at least one of purple, blue, green, red, and infrared light emitting device packages in a light emitting device package emitting white light by combining yellow, green, red, or orange phosphors with a blue light emitting device, whereby a color temperature and CRI of white light may be adjusted. The aforementioned white light source module may be employed as a light source in various types of lighting devices.

In a single light emitting device package, light having a desired color may be determined according to wavelengths of an LED chip as a light emitting device and types and mixing ratios of phosphors. In the case of white light, a color temperature and a CRI may be adjusted.

For example, in a case in which an LED chip emits blue light, a light emitting device package including at least one of yellow, green, and red phosphors may emit white light having various color temperatures according to mixing ratios of phosphors. In contrast, a light emitting device package in which a green or red phosphor is applied to a blue LED chip may emit green or red light. In this manner, a color temperature or a CRI of white light may be adjusted by combining a light emitting device package emitting white light and a light emitting device package emitting green or red light. Also, a light emitting device package may be configured to include at least one of light emitting devices emitting purple, blue, green, red, or infrared light.

In this case, the lighting device may control a color rendering index (CRI) to range from the level of light emitted by a sodium lamp to the level of sunlight, and may control a color temperature ranging from 1500K to 20000K to generate various levels of white light. In some example embodiments, the lighting device may generate visible light having purple, blue, green, red, orange colors, or infrared light to adjust an illumination color according to a surrounding atmosphere or mood. Also, the lighting device may generate light having a special wavelength stimulating plant growth.

White light generated by combining yellow, green, and red phosphors to a blue light emitting device and/or by combining green and red light emitting devices thereto may have two or more peak wavelengths, and, as illustrated in FIG. 20, (x,y) coordinates may be positioned in a segment linking (0.4476, 0.4074), (0.3484, 0.3516), (0.3101, 0.3162), (0.3128, 0.3292), (0.3333, 0.3333) of the CIE 1931 chromaticity diagram. Alternatively, the (x,y) coordinates may be positioned in a region surrounded by the segment and a spectrum of black body radiation. A color temperature of white light corresponds to a range from about 1500K to about 20000K. In FIG. 20, white light in the vicinity of point E (0.3333, 0.3333) present in a lower portion of the spectrum of black body radiation is in a state in which light of a yellow component is relatively weak, which may be used as a light source for illumination in a region which a vivid or fresh feeling for the naked eye is provided. Thus, lighting products using white light in the vicinity of point E (0.3333, 0.3333) in the lower portion of the spectrum of black body radiation may be effectively used as lighting in stores selling groceries or clothes.

Figure 21:
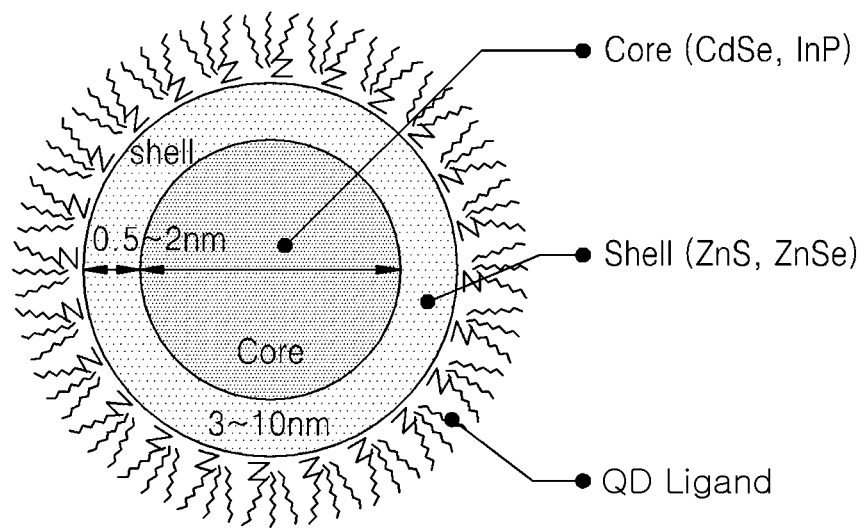
FIG. 21 is a view illustrating a cross-sectional structure of a quantum dot.

FIG. 21 is a view illustrating a wavelength conversion material that may be applied to a light emitting device package according to an example embodiment.

Various materials such as phosphors and/or quantum dots may be used as materials for converting a wavelength of light emitted from the light emitting device.

In an example embodiment, phosphors applied to wavelength conversion materials may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ (0.5≤x≤3, 0<z<0.3, 0<y≤4) - - - Equation (1)

In Equation (1), Ln may be at least one type of element selected from the group consisting of Group Ma elements and rare earth elements, and M may be at least one type of element selected from the group consisting of calcium (Ca), barium (Ba), strontium (Sr), and magnesium (Mg).

Fluorides: KSF-based red $K_2SiF_6:Mn_4^+$, $K_2TiF_6:Mn_4^+$, $NaYF_4:Mn_4^+$, $NaGdF_4:Mn_4^+$ (for example, a composition ratio of Mn may be $0<z\leq0.17$).

Phosphor compositions should basically conform with stoichiometry, and respective elements may be substituted with different elements of respective groups of the periodic table. For example, strontium (Sr) may be substituted with barium (Ba), calcium (Ca), magnesium (Mg), and the like, of alkaline earth metals, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

In particular, in order to enhance reliability at high temperatures and high humidity, the fluoride-based red phosphor may be coated with a fluoride not containing manganese (Mn) or may further include an organic substance coated on a surface of the fluoride coating not containing manganese (Mn). Unlike any other phosphor, the fluoride-based red phosphor may realize a narrow full width at half maximum (FWHM) equal to or less than 40 nm, and thus, it may be utilized in high resolution TVs such as UHD TVs.

Table 1 below illustrates types of phosphors that may be applied in application fields in a light emitting device package using a blue LED chip having a dominant wavelength of 440 nm to 460 nm or a UV LED chip having a dominant wavelength of 380 nm to 440 nm.

The quantum dot may realize various colors according to sizes and, in particular, when the quantum dot is used as a phosphor substitute, the quantum dot may be used as a red or green phosphor. The use of a quantum dot may realize a narrow FWHM (e.g., about 35 nm).

The wavelength conversion material may be realized in the form of being contained in an encapsulant, or alternatively, the wavelength conversion material may be manufactured as a film in advance and attached to a surface of an optical structure such as an LED chip or a light guide plate so as to be used. In a case in which a wavelength configuration material previously manufactured as a film is used, a wavelength conversion material having a uniform thickness may be easily realized.

FIGS. 22 through 30 are views illustrating backlight modules including a light emitting device package according to an example embodiment.

Figure 22:
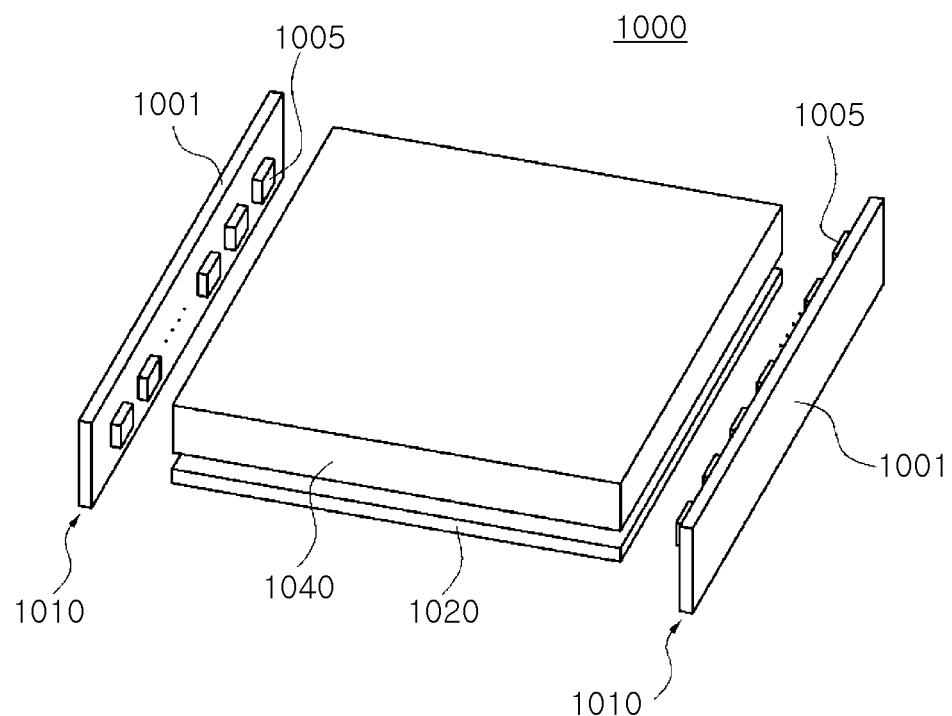
FIGS. 22 through 30 are views illustrating backlight modules including a light emitting device package according to example embodiments.

Referring to FIG. 22, a backlight module 1000 may include a light guide plate 1040 and light source modules 1010 provided on opposite sides of the light guide plate 1040. Also, the backlight module 1000 may further include a reflective plate 1020 disposed below the light guide plate 1040. The backlight module 1000 according to the present example embodiment may be an edge type backlight module.

According to an example embodiment, the light source module 1010 may be provided only on one side of the light guide plate 1040, or may be provided on opposite sides thereof as shown in FIG. 22. The light source module 1010 may include a printed circuit board (PCB) 1001 and a plurality of light sources 1005 mounted on an upper surface of the PCB 1001. The various light emitting device packages

TABLE 1

| Purpose | Phosphor |
| --- | --- |
| LED TV BLU | β-SiAlON: $Eu^{2+}$, (Ca, Sr)AlSiN$_3$: $Eu^{2+}$, $La_3Si_6N_{11}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Lighting | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Side Viewing (Mobile Devices, Laptop PCs) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, (Sr, Ba, Ca, Mg)$_2$SiO$_4$: $Eu^{2+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ $(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |
| Electrical Components (Headlamps, etc.) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}(0.5 \leq x \leq 3, 0 < z < 0.3, 0 < y \leq 4)$, $K_2TiF_6$: $Mn^{4+}$, $NaYF_4$: $Mn^{4+}$, $NaGdF_4$: $Mn^{4+}$ |

The wavelength conversion material may include quantum dots (QD) provided to be used in the place of phosphors or mixed with phosphors.

FIG. 21 is a view illustrating a cross-sectional structure of a quantum dot.

A quantum dot (QD) may have a core-shell structure including Group III-V or Group II-VI compound semiconductors. For example, the quantum dot may have a core such as CdSe or InP or a shell such as ZnS or ZnSe. Also, the quantum dot may include a ligand to stabilize the core and shell. For example, the core may have a diameter ranging from 1 to 30 nm, preferably, 3 to 10 nm. The shell may have a thickness ranging from 0.1 to 20 nm, preferably, 0.5 to 2 nm.

100, 200, 300, and 400 described above with reference to FIGS. 1 through 12 may be applied to the plurality of light sources 1005.

Figure 23:
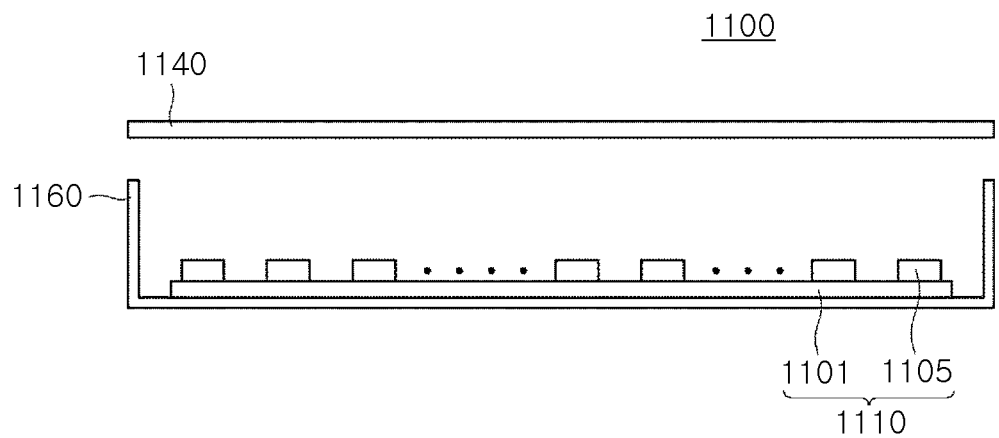

FIG. 23 is a view illustrating an example embodiment of a direct type backlight module.

Referring to FIG. 23, a backlight module 1100 may include a light diffuser 1140 and a light source module 1110 arranged below the light diffuser 1140. Also, the backlight module 1100 may further include a bottom case 1160 disposed below the light diffuser 1140 and accommodating the light source module 1110. The backlight module 1100 according to the present example embodiment may be a direct type backlight module.

The light source module 1110 may include a PCB 1101 and a plurality of light sources 1105 mounted on an upper surface of the PCB 1101. The various light emitting device packages 100, 200, 300, and 400 described above with reference to FIGS. 1 through 12 may be applied to the plurality of light sources 1105.

Figure 24:
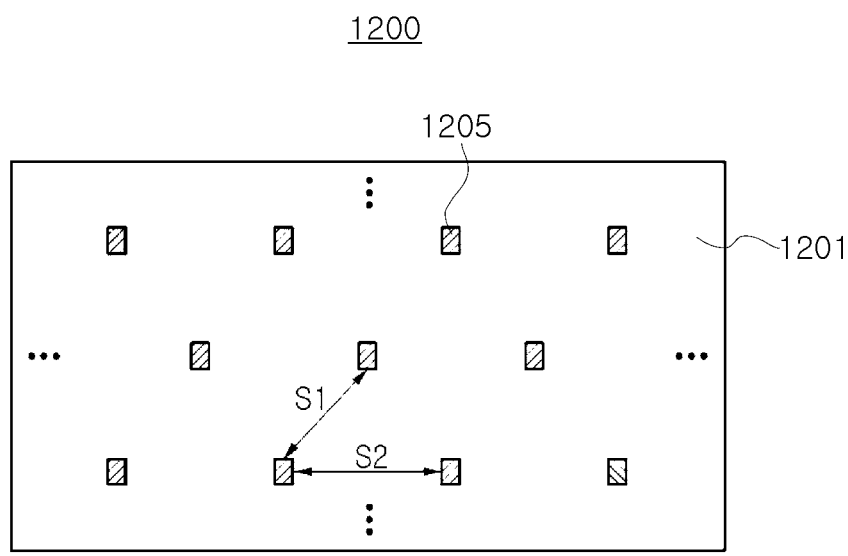

FIG. 24 is a view illustrating an example of disposition of light sources in a direct type backlight module.

A direct type backlight module 1200 according to the present example embodiment may include a plurality of light sources 1205 arranged on a board 1201.

The arrangement structure of the light sources 1205 is a matrix structure in which the light sources 1205 are arranged in rows and columns, and here, the rows and columns have a zigzag form. This arrangement is a structure in which a second matrix having the same form as that of a first matrix is disposed within the first matrix in which the plurality of light sources 1205 are arranged rows and columns in straight lines, which may be understood as that each light source 1205 of the second matrix is positioned within a quadrangle formed by four adjacent light sources 1205 included in the first matrix.

However, in the backlight module 1200 according to the example embodiment illustrated in FIG. 24, in order to enhance uniformity of brightness and light efficiency, in some example embodiments, the first and second matrices may have different disposition structures and intervals. Also, in addition to the method of disposing the plurality of light sources, distances S1 and S2 between adjacent light sources may be optimized to secure uniformity of brightness.

Since the rows and columns of the light sources 1205 are disposed in a zigzag manner, rather than being aligned, the number of light sources 1205 may be reduced by about 15% to 25% with respect to the same light emitting area.

Figure 25:
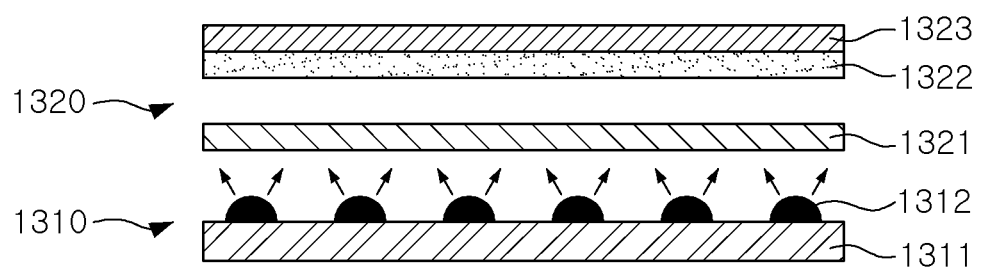

FIG. 25 is a view illustrating another example embodiment of a direct type backlight module.

Referring to FIG. 25, a backlight module 1300 according to the present example embodiment may include an optical sheet 1320 and a light source module 1310 arranged below the optical sheet 1320.

The optical sheet 1320 may include a diffusion sheet 1321, a light collecting sheet 1322, and a protective sheet 1323. A configuration and arrangement order of the sheets 1321 and 1323 are not limited to those illustrated in FIG. 25 and may be variously modified.

The light source module 1310 may include a circuit board 1311 and a plurality of light source units 1312 mounted on the circuit board 1311. The light source units 1312 may employ the various light emitting device packages 100, 200, 300, and 400 described above with reference to FIGS. 1 through 12, and an optical member adjusting a path of light emitted from the light sources may be provided on the light sources.

The optical member may adjust a beam angle of light through refraction, and in particular, the optical member may be a beam angle lens spreading light from the light sources 1312 to a wider region. Since the light source units 1312 with the optical member attached thereto have wider light distribution, when the light source module 1310 is used in a backlight or planar type lighting, the number of light source units 1312 for the same area may be reduced.

Figure 26:
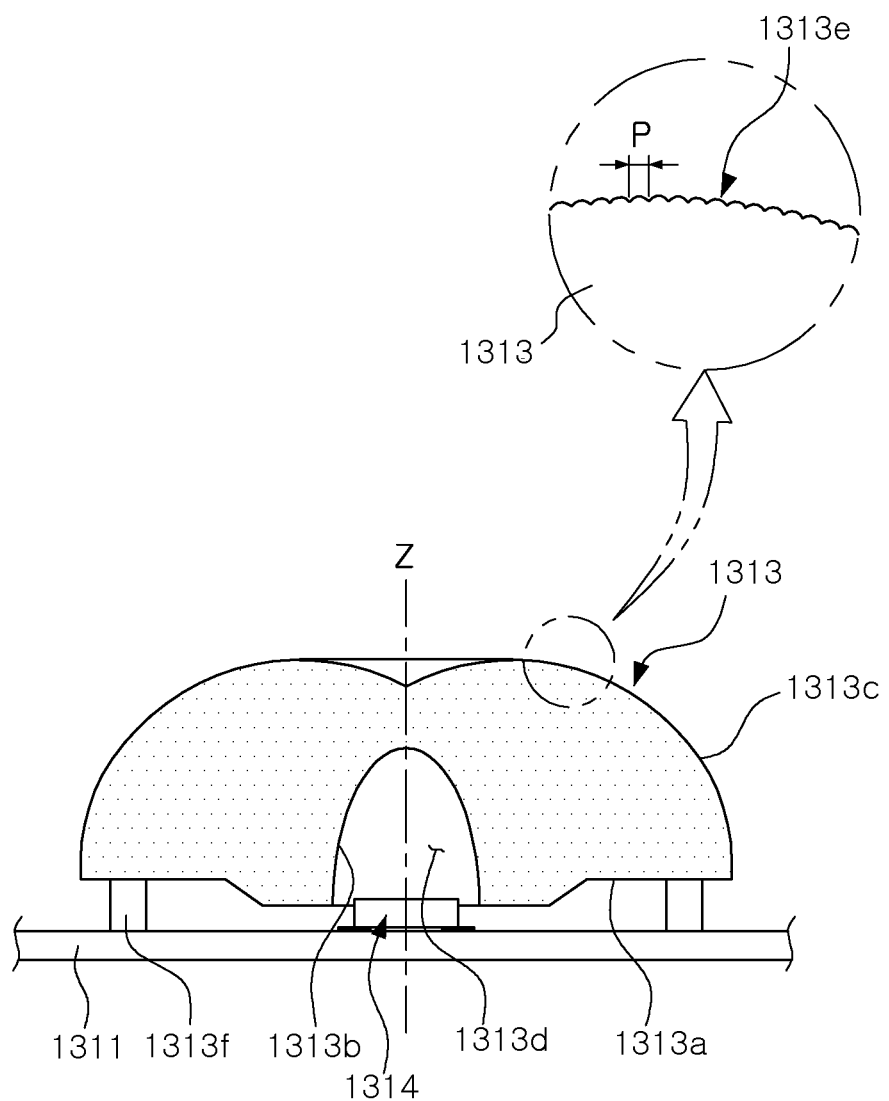

FIG. 26 is an enlarged view of the light source unit 1312 illustrated in FIG. 25.

Referring to FIG. 26, each of the plurality of light source units 1312 may include a light source 1314 including the various light emitting device packages 100, 200, 300, or 400, and an optical member 1313. The optical member 1313 may include a bottom surface 1313*a* disposed on the light source 1314, an incident surface 1313*b* to which light from the light source 1314 is incident, and an output surface 1313*c* from which light is emitted outwardly.

The bottom surface 1313*a* may have a recess portion 1313*d* formed in the center through which an optical axis Z passes, and depressed in a direction toward the output surface 1313*c*. A surface of the recess portion 1313*d* may be defined as the incident surface 1313*b* to which light from the light source 1314 is incident. That is, the incident surface 1313*b* may form the surface of the recess portion 1313*d*.

A central region of the bottom surface 1313*a* connected to the incident surface 1313*b* partially protrudes to the light source 1314, forming an overall non-flat structure. That is, unlike a general structure in which the entirety of the bottom surface 1313*a* is flat, the bottom surface 1313*a* has a structure in which portions thereof protrude along the circumference of the recess portion 1313*d*. A plurality of support portions 1313*f* may be provided on the bottom surface 1313*a*, and when the optical member 1313 is mounted on the circuit board 1311, the plurality of support portions 1313*f* may fixedly support the optical member 1313.

The output surface 1313*c* protrudes to have a dome shape in an upward direction (a light output direction) from the edge connected to the bottom surface 1313*a*, and the center of the output surface 1313*c* through which the optical axis Z passes is depressed to be concave toward the recess portion 1313*d*, having a point of inflection.

A plurality of irregular portions 1313*e* (see inset in FIG. 26) may be periodically arranged in a direction from the optical axis Z toward the edge. The plurality of irregular portions 1313*e* may have an annular shape corresponding to a horizontal cross-sectional shape of the optical element 1313, and form a concentric circle with respect to the optical axis Z. The plurality of irregular portions 1313*e* may be arranged to be radially spread in periodical patterns on the surface of the output surface 1313*c* with the optical axis Z as a center.

The plurality of irregular portions 1313*e* may be spaced apart by a period (pitch) P so as to form patterns. The pitch may be predetermined. The period P between the plurality of irregular portions 1313*e* may range from 0.01 mm to 0.04 mm. The plurality of irregular portions 1313*e* may cancel out a difference in performance between optical elements due to a fine processing error that may occur during a process of manufacturing the optical elements 1313, thereby enhancing uniformity of light distribution.

Figure 27:
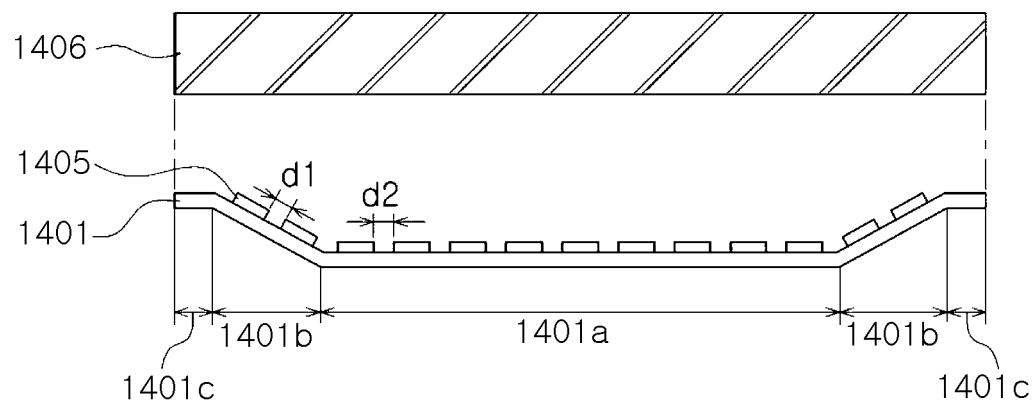

FIG. 27 is a view illustrating another example embodiment of a direct type backlight module.

Referring to FIG. 27, a backlight module 1400 includes at least one light source 1405 mounted on a circuit board 1401 and at least one optical sheet 1406 disposed thereabove. The light source 1405 may include the various light emitting device packages 100, 200, 300, and 400 according to example embodiments described above.

The circuit board 1401 employed in the present example embodiment may have a first planar portion 1401*a* corresponding to a main region, a sloped portion 1401*b* disposed around the first planar portion 1401*a* and bent in at least a portion thereto, and a second planar portion 1401*c* disposed on the edge of the circuit board 1401, namely, an outer side of the sloped portion 1401*b*. The light sources 1405 are arranged at a first interval d1 on the sloped portion 1401*b*, and one or more light sources 1405 may be arranged at a second interval on the first planar portion 1401*a*. The first interval d1 may be equal to the second interval d2. A width of the sloped portion 1401b (or a length in the cross-section) may be smaller than that of the first planar portion 1401a and may be larger than a width of the second planar portion 1401c. Also, in some example embodiments, at least one light source 1405 may be arranged on the second planar portion 1401c.

A slope of the sloped portion 1401b may be appropriately adjusted within a range from 0 to 90 degrees with respect to the first planar portion 1401a, and with this structure, the circuit board 1401 may maintain uniform brightness even in the vicinity of the edge of the optical sheet 1406.

Figure 28:
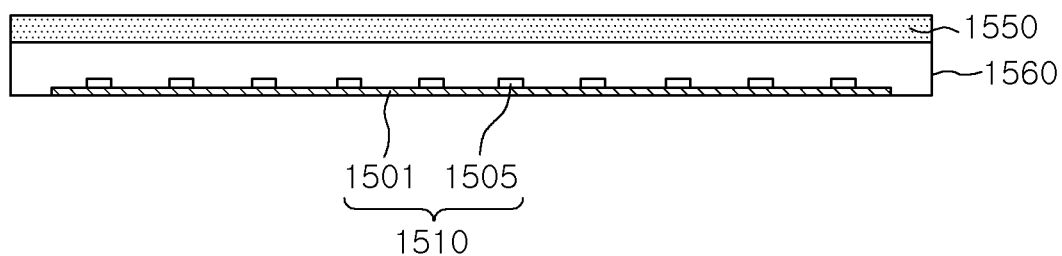
Figure 29:
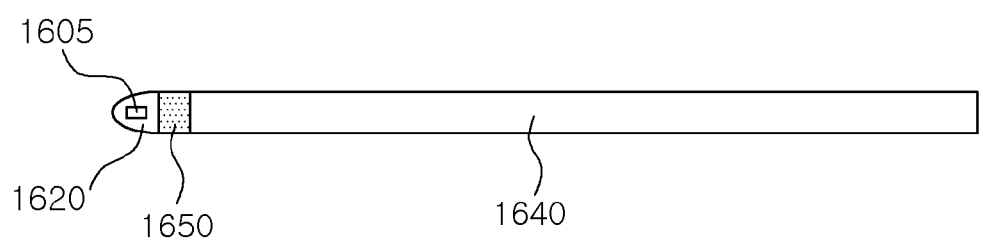
Figure 30:
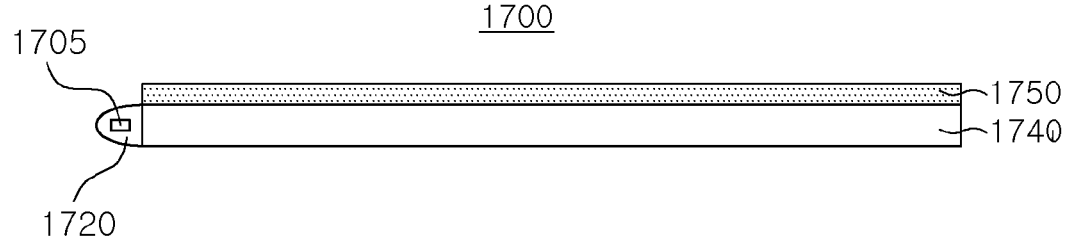

FIGS. 28 through 30 illustrate backlight modules 1500, 1600, and 1700, respectively, in which wavelength conversion modules 1550, 1650, and 1750 are disposed outside of light sources 1505, 1605, and 1705, respectively, rather than being disposed in the light sources 1505, 1605, and 1705, to convert light, respectively.

Referring to FIG. 28, the backlight module 1500 is a direct type backlight module including the wavelength conversion module 1550, a light source module 1510 arranged below the wavelength conversion module 1550, and a bottom case 1560 accommodating the light source module 1510. Also, the light source module 1510 may include a PCB 1501 and a plurality of light sources 1505 mounted on an upper surface of the PCB 1501.

In the backlight module 1500 according to the present example embodiment, the wavelength conversion module 1550 may be disposed above the bottom case 1560. Thus, at least a partial amount of light emitted from the light source module 1510 may be wavelength-converted by the wavelength conversion module 1550. The wavelength conversion module 1550 may be manufactured as a separate film and applied, or alternatively, the wavelength conversion module 1550 may be integrally combined with a light diffuser (not shown) so as to be provided. When the wavelength conversion module is manufactured as a separate film and applied, the wavelength conversion module 1550 may include the wavelength conversion films 120, 220, 320, and 420 described above with reference to FIGS. 1 through 12.

Referring to FIGS. 29 and 30, backlight modules 1600 and 1700 are edge type backlight modules respectively including wavelength conversion modules 1650 and 1750, respectively, light guide plates 1640 and 1740, respectively, and reflective units 1620 and 1720, respectively, and light sources 1605 and 1705, respectively, disposed on one side of the light guide plates 1640 and 1740, respectively.

Light emitted from the light sources 1605 and 1705 may be guided to the interior of the light guide plates 1640 and 1740 by the reflective units 1620 and 1720, respectively. In the backlight module 1600 of FIG. 29, the wavelength conversion module 1650 may be disposed between the light guide plate 1640 and the light source 1605. In the backlight module 1700 of FIG. 30, the wavelength conversion module 1750 may be disposed on a light emitting surface of the light guide plate 1740.

In FIGS. 28 through 30, the wavelength conversion modules 1550, 1650, and 1750 may include a general phosphor. In particular, in the case of using a quantum dot phosphor to complement characteristics of a quantum dot vulnerable to heat or moisture from a light source, the structures of wavelength conversion modules 1550, 1650, and 1750 illustrated in FIGS. 28 through 30 may be utilized in the backlight modules 1500, 1600, and 1700.

Figure 31:
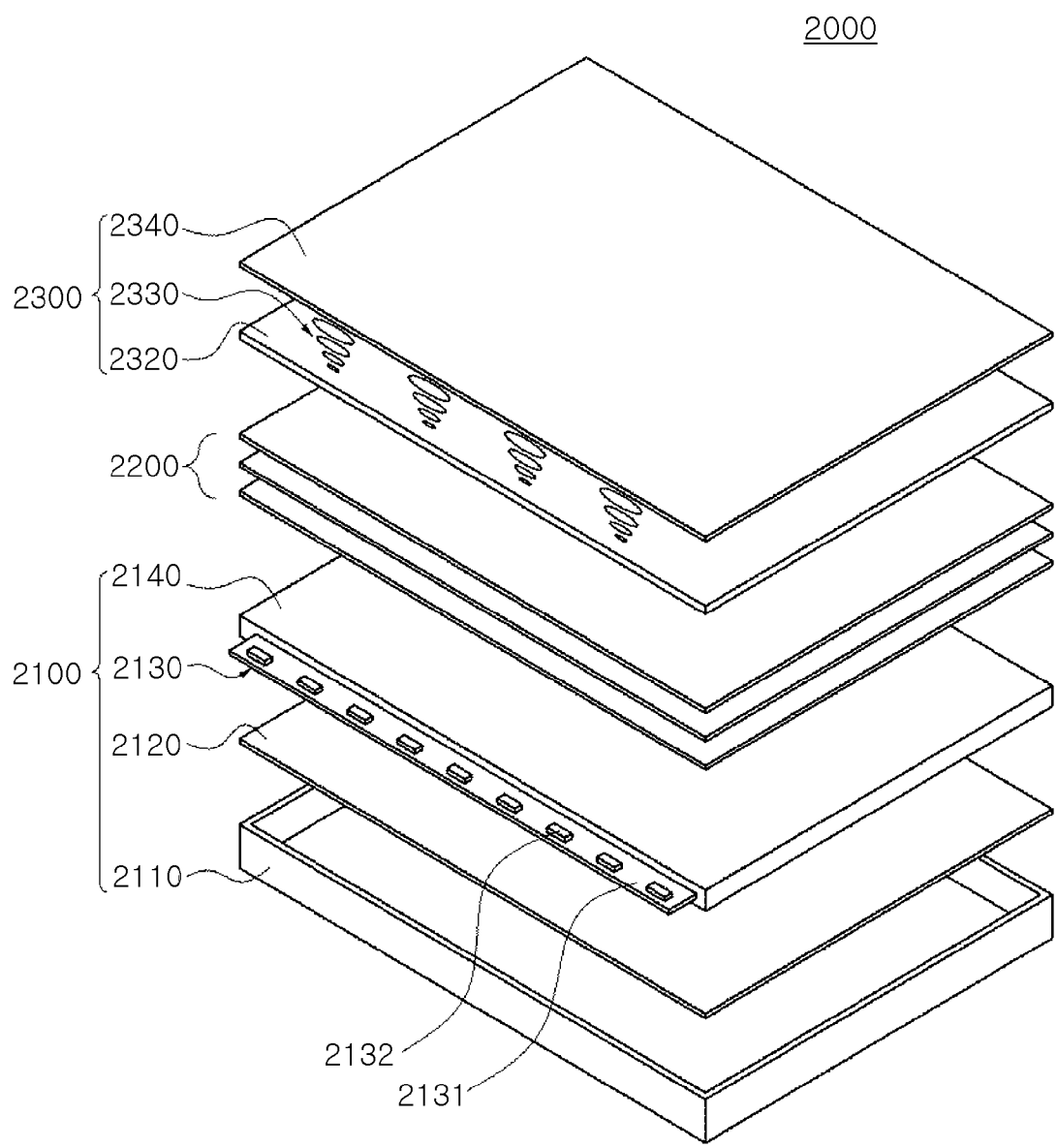
FIG. 31 is an exploded perspective view schematically illustrating a display device including a light emitting device package according to an example embodiment.

FIG. 31 is an exploded perspective view schematically illustrating a display device including a light emitting device package according to an example embodiment.

Referring to FIG. 31, a display apparatus 2000 may include a backlight module 2100, an optical sheet 2200, and an image display panel 2300 such as a liquid crystal panel.

The backlight module 2100 may include a bottom case 2110, a reflective plate 2120, a light guide plate 2140, and a light source module 2130 provided on at least one side of the light guide plate 2140. The light source module 2130 may include a PCB 2131 and light sources 2132. In particular, the light sources 2132 may include the various light emitting device packages 100, 200, 300, and 400 described above with reference to FIGS. 1 through 12.

The optical sheet 2200 may be disposed between the light guide plate 2140 and the image display panel 2300 and may include various types of sheets such as a diffusion sheet, a prism sheet, and a protective sheet.

The image display panel 2300 may display an image using light output from the optical sheet 2200. The image display panel 2300 may include an array substrate 2320, a liquid crystal layer 2330, and a color filter substrate 2340. The array substrate 2320 may include pixel electrodes disposed in a matrix form, thin film transistors (TFTs) applying a driving voltage to the pixel electrodes, and signal lines operating the TFTs. The color filter substrate 2340 may include a transparent substrate, a color filter, and a common electrode. The color filter may include filters allowing light having a particular wavelength, included in white light emitted from the backlight module 2100, to selectively pass therethrough. The liquid crystal layer 2330 is rearranged by an electric field interposed between the pixel electrodes and the common electrode to adjust light transmittance. Light adjusted in transmittance may pass through the color filter of the color filter substrate 2340, thus displaying an image. The image display panel 2300 may further include a driving circuit unit processing an image signal, or the like.

The display apparatus 2000 according to the present example embodiment uses the light sources 2132 emitting blue light, green light, and red light having a relatively small FWHM. Thus, emitted light, after passing through the color filter substrate 2340, may realize blue, green, and red colors having a high level of color purity.

FIGS. 32 through 35 are views schematically illustrating lighting devices including a light emitting device package according to various example embodiments.

Figure 32:
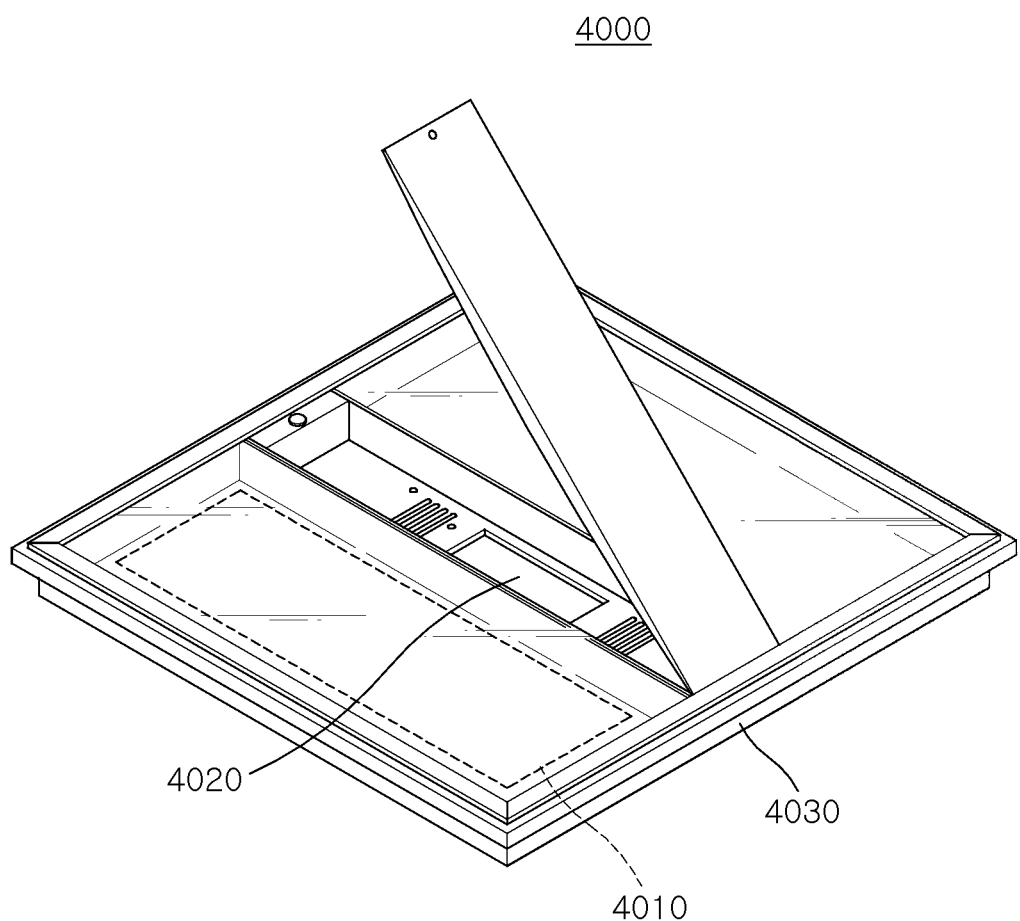
FIGS. 32 through 35 are views schematically illustrating lighting devices including a light emitting device package according to example embodiments.

Referring to FIG. 32, a planar type lighting device 4000 may include a light source module 4010, a power supply device 4020, and a housing 4030. According to an example embodiment of the present disclosure, the light source module 4010 may include a light emitting device array, as a light source, and the power supply device 4020 may include a light emitting device driving unit.

The light source module 4010 may include a light emitting device array and may be formed to have an overall planar shape. According to an example embodiment of the present disclosure, the light emitting device array may include a light emitting device and a controller storing driving information of the light emitting device. The light emitting device array may include a plurality of light emitting device packages connected in series or parallel, and in an example embodiment, the light emitting device array may employ the various light emitting device packages 100, 200, 300, and 400 described above with reference to FIGS. 1 through 12.

The power supply device 4020 may be configured to supply power to the light source module 4010. The housing 4030 may have an accommodation space accommodating the light source module 4010 and the power supply device 4020 therein and have a hexahedral shape with one side thereof opened, but the shape of the housing 4030 is not limited thereto. The light source module 4010 may be disposed to emit light to the opened one side of the housing 4030.

Figure 33:
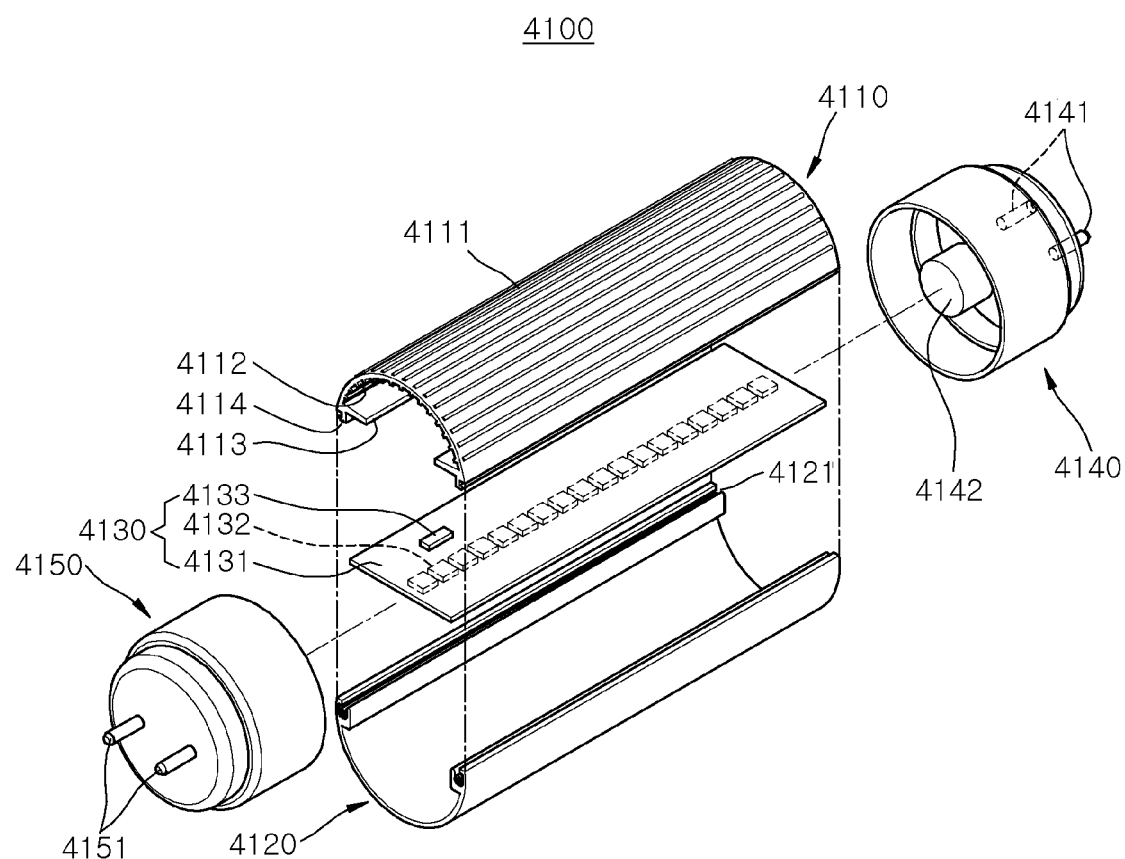

FIG. 33 is an exploded perspective view schematically illustrating a bar type lamp as a lighting device according to an example embodiment.

Referring to FIG. 33, a lighting device 4100 includes a heat dissipation member 4110, a cover 4120, a light source module 4130, a first socket 4140, and a second socket 4150. A plurality of heat dissipation fins 4111 and 4112 may be formed in a concavo-convex pattern on an internal and/or external surface of the heat dissipation member 4110, and the heat dissipation fins 4111 and 4112 may be designed to have various shapes and intervals (spaces) therebetween. A support 4113 having a protruding shape is formed on an inner side of the heat dissipation member 4110. The light source module 4130 may be fixed to the support 4113. Stoppage protrusions 4114 may be formed at both ends of the heat dissipation member 4110.

The stoppage recesses 4121 may be formed in the cover 4120, and the stoppage protrusions 4114 of the heat dissipation member 4110 may be coupled to the stoppage recesses 4121 in a hook coupling manner. The positions of the stoppage recesses 4121 and the stoppage protrusions 4114 may be interchanged.

The light source module 4130 may include a light emitting device array. The light source module 4130 may include a PCB 4131, a light source 4132, and a controller 4133. As described above, the controller 4133 may store driving information of the light source 4132. Circuit wirings are formed on the PCB 4131 to operate the light source 4132. Also, components for operating the light source 4132 may be provided on the PCB 4131.

The first and second sockets 4140 and 4150, a pair of sockets, are coupled to both ends of the cylindrical cover module including the heat dissipation member 4110 and the cover 4120. For example, the first socket 4140 may include electrode terminals 4141 and a power source device 4142, and dummy terminals 4151 may be disposed on the second socket 4150. Also, an optical sensor and/or a communications module may be installed in either the first socket 4140 or the second socket 4150. For example, the optical sensor and/or the communications module may be installed in the second socket 4150 in which the dummy terminals 4151 are disposed. In another example, the optical sensor and/or the communications module may be installed in the first socket 4140 in which the electrode terminals 4141 are disposed.

Figure 34:
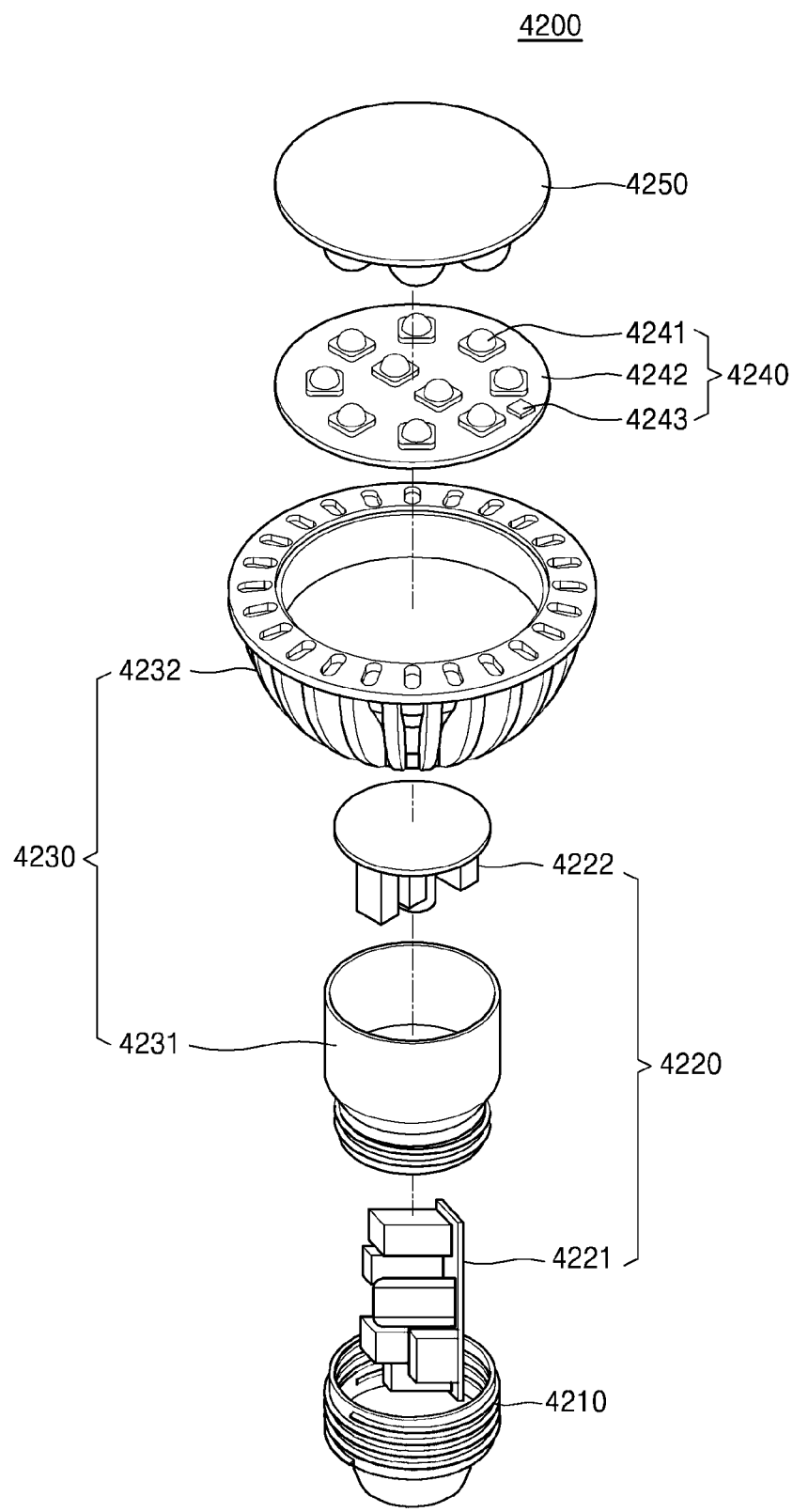

FIG. 34 is an exploded perspective view schematically illustrating a bulb type lamp as a lighting device according to an example embodiment.

In detail, a lighting device 4200 may include a socket 4210, a power source module 4220, a heat dissipation module 4230, a light source module 4240, and an optical module 4250. According to an example embodiment of the present disclosure, the light source module 4240 may include a light emitting device array, and the power source module 4220 may include a light emitting device driving module.

The socket 4210 may be configured to be replaced with an existing lighting device. Power supplied to the lighting device 4200 may be applied through the socket 4210. As illustrated, the power source module 4220 may include a first power source module 4221 and a second power source module 4222. The first power source module 4221 and the second power source module 4222 may be assembled to form the power source unit 4220. The heat dissipation module 4230 may include an internal heat dissipation module 4231 and an external heat dissipation module 4232. The internal heat dissipation module 4231 may be directly connected to the light source module 4240 and/or the power source module 4220 so as to transmit heat to the external heat dissipation module 4232. The optical module 4250 may include an internal optical module (not shown) and an external optical module (not shown) and may be configured to evenly distribute light emitted from the light source module 4240.

The light source module 4240 may emit light to the optical module 4250 upon receiving power from the power source module 4220. The light source module 4240 may include one or more light emitting devices 4241, a circuit board 4242, and a controller 4243. The controller 4243 may store driving information of the light emitting devices 4241.

Figure 35:
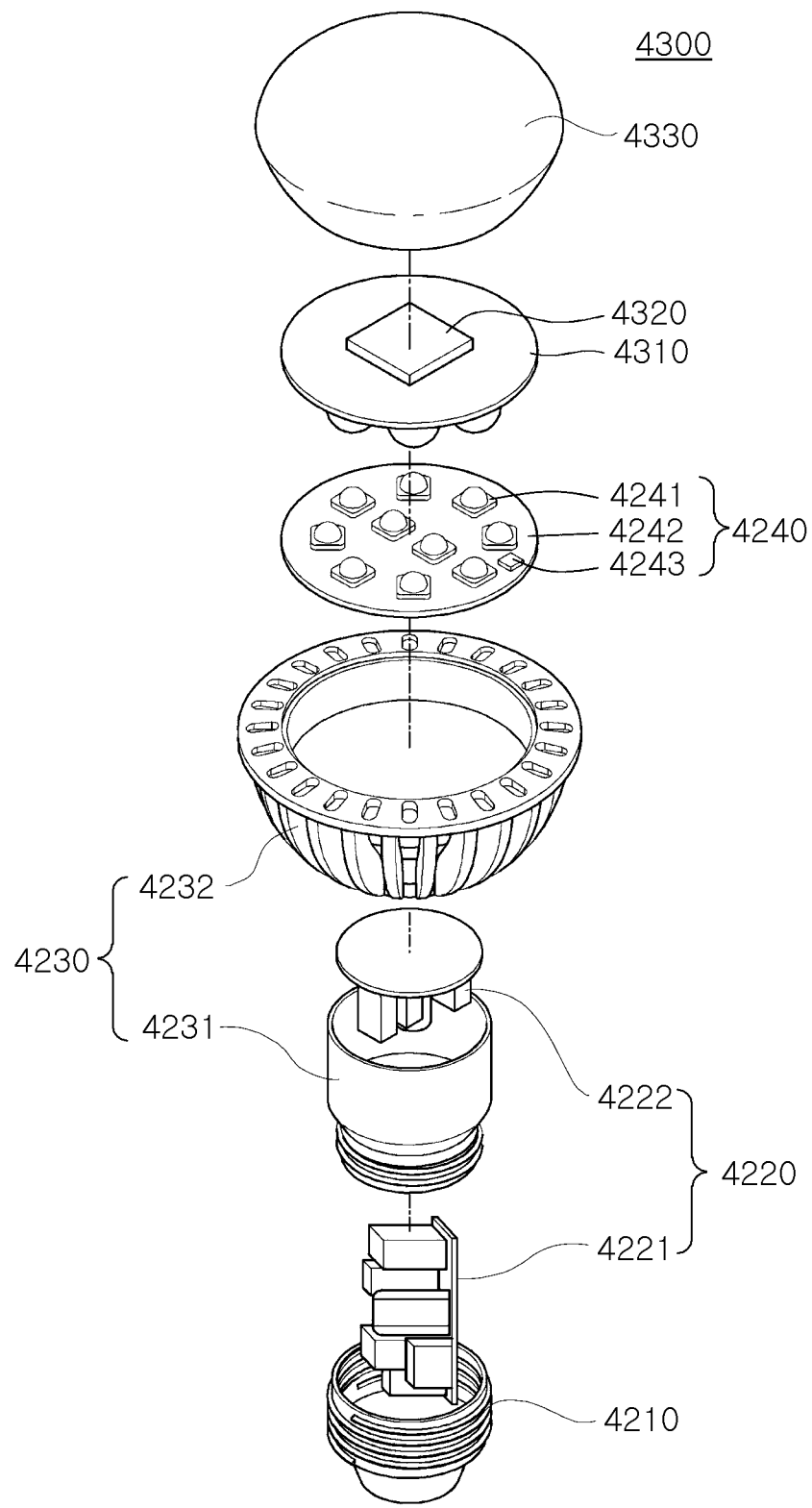

FIG. 35 is an exploded perspective view schematically illustrating a lamp including a communications module, as a lighting device, according to an example embodiment.

In detail, unlike the lighting device 4200 illustrated in FIG. 34, a lighting device 4300 according to the present example embodiment has a reflective plate 4310 provided above the light source module 4240, and here, the reflective plate 4310 serves to allow light from the light source to be evenly spread laterally and backwardly, reducing glare (dazzling).

A communications module 4320 may be mounted on an upper portion of the reflective plate 4310, and home network communication may be realized through the communications module 4320. For example, the communications module 4320 may be a wireless communications module using ZigBee, Wi-Fi, or visible light communications (VLC) technology (or light fidelity (Li-Fi)), and control lighting installed within or outside of a household, such as turning on or off a lighting device, adjusting brightness of a lighting device, and the like, through a smartphone or a wireless controller. Also, home appliances or an automobile system within or outside of a household, such as a TV, a refrigerator, an air-conditioner, a door lock, or automobiles, and the like, may be controlled through a Li-Fi communications module using visible wavelengths of the lighting device installed within or outside of the household.

The reflective plate 4310 and the communications module 4320 may be covered by a cover 4330.

Figure 36:
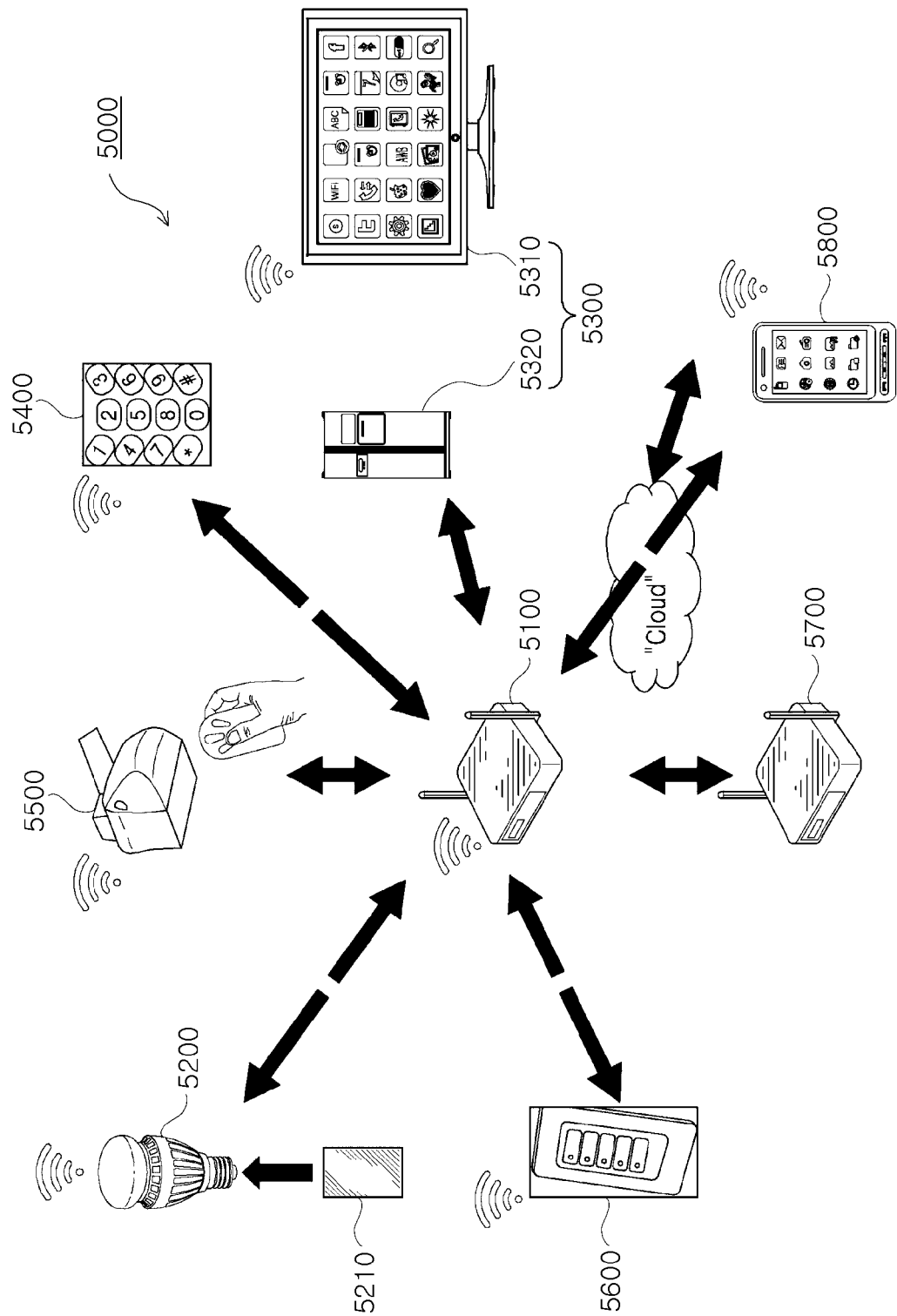
FIGS. 36 through 38 are views schematically illustrating network systems including a light emitting device package according to example embodiments.
Figure 37:
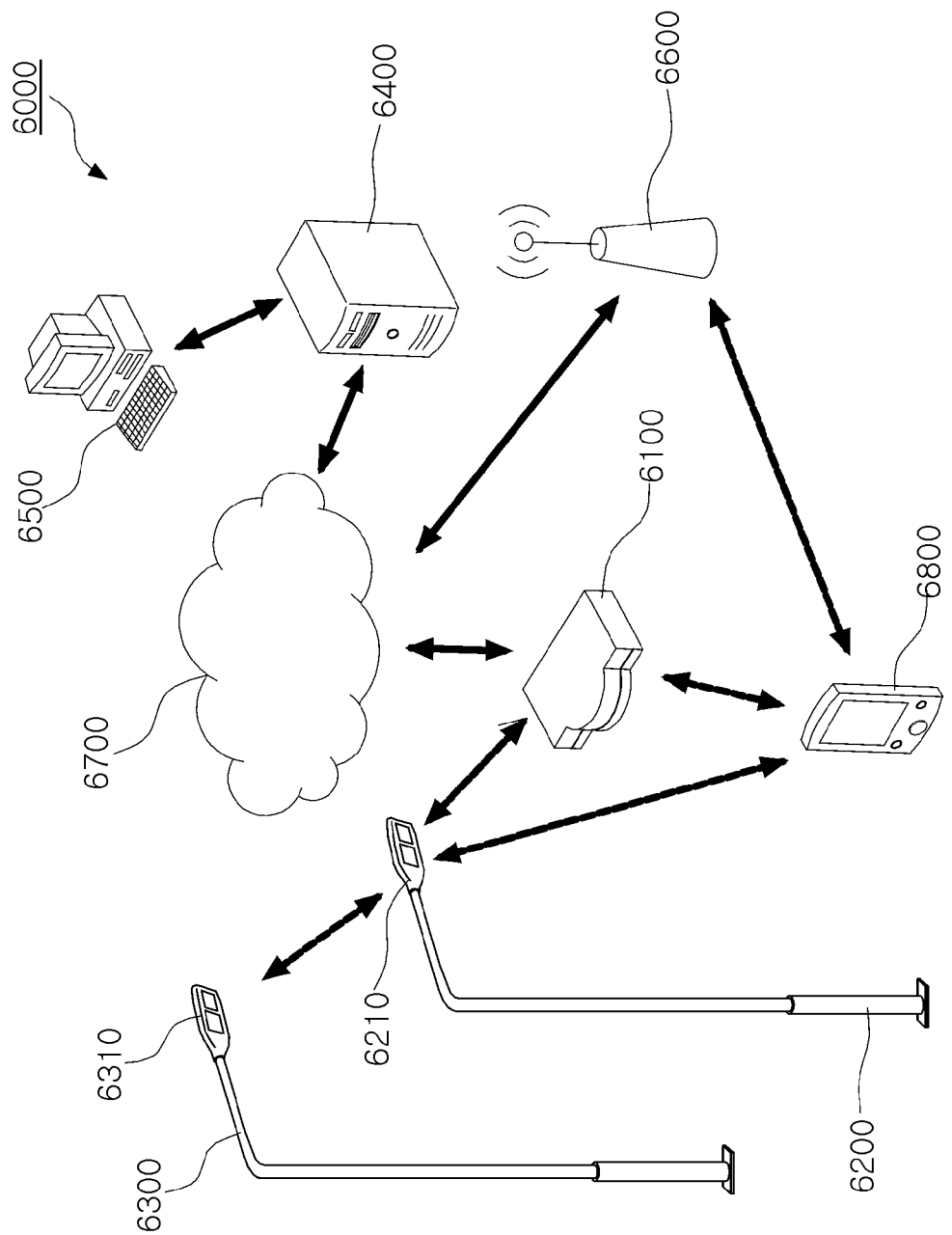
Figure 38:
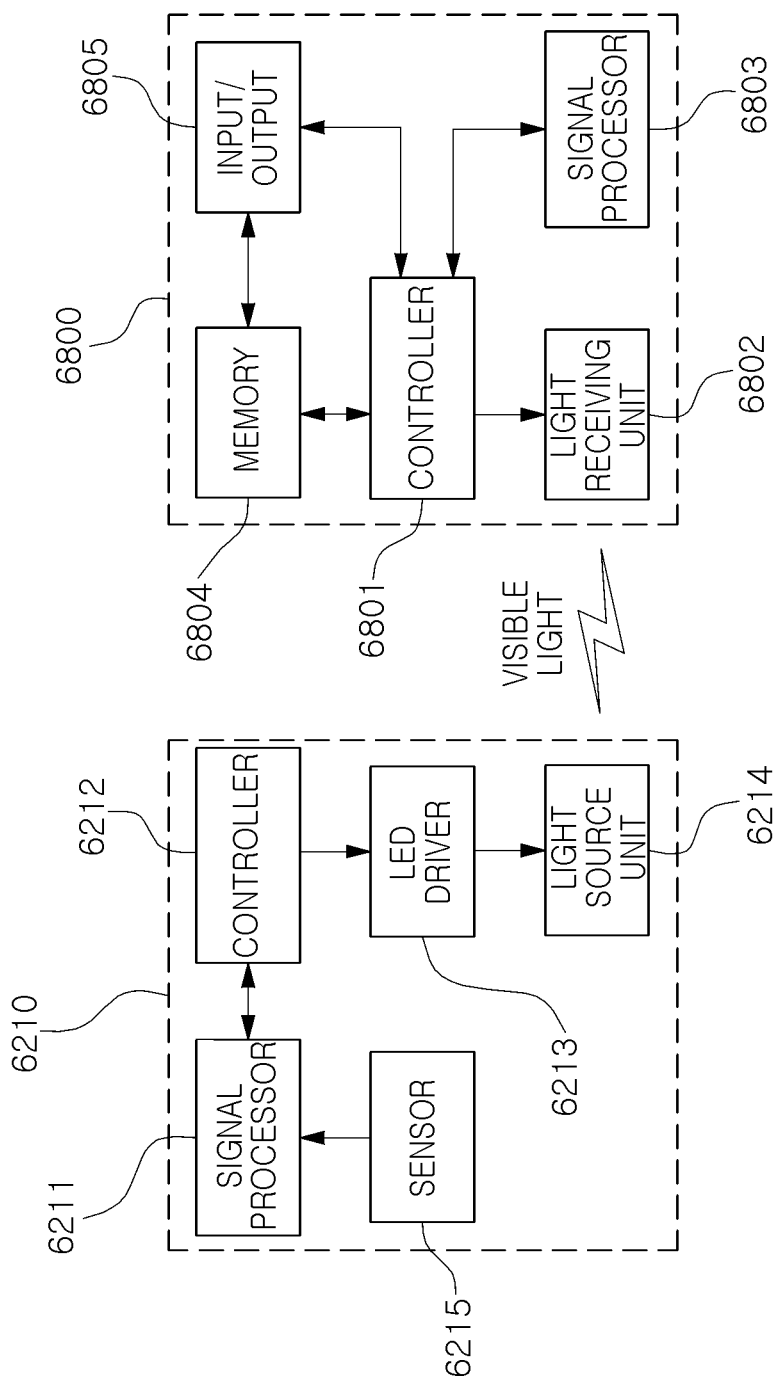

FIGS. 36 through 38 are views schematically illustrating a network system including a light emitting device package according to various example embodiments.

FIG. 36 is a view schematically illustrating an indoor lighting control network system. A network system 5000 may be a complex smart lighting-network system combining lighting technology using a light emitting device such as an LED, or the like, Internet of Things (IoT) technology, wireless communications technology, and the like. The network system 5000 may be realized using various lighting devices and wired/wireless communications devices, and may be realized by a sensor, a controller, a communications unit, software for network control and maintenance, and the like.

The network system 5000 may be applied even to an open space such as a park or a street, as well as to a closed space defined within a building such as a house or an office. The network system 5000 may be realized on the basis of the IoT environment in order to collect and process a variety of types of information and provide the same to users. Here, an LED lamp 5200 included in the network system 5000 may serve to check and control operational states of other devices 5300 to 5800 included in the IoT environment on the basis of a function such as visible light communications, or the like, of the LED lamp 5200, as well as receiving information regarding a surrounding environment from a gateway 5100 and controlling lighting of the LED lamp 5200 itself.

Referring to FIG. 36, the network system 5000 may include the gateway 5100 processing data transmitted and received according to different communications protocols, the LED lamp 5200 connected to be available for communicating with the gateway 5100 and including an LED light emitting device, and a plurality of devices 5300 to 5800 connected to be available for communicating with the gateway 5100 according to various wireless communications schemes. In order to realize the network system 5000 on the basis of the IoT environment, each of the devices 5300 to 5800, as well as the LED lamp 5200, may include at least one communications module. In an example embodiment, the LED lamp 5200 may be connected to be available for communicating with the gateway 5100 according to wireless communications protocols such as Wi-Fi, ZigBee, or Li-Fi, and to this end, the LED lamp 5200 may include at least one communications module 5210 for a lamp.

As mentioned above, the network system 5000 may be applied even to an open space such as a park or a street, as well as to a closed space such as a house or an office. When the network system 5000 is applied to a house, the plurality of devices 5300 to 5800 included in the network system and connected to be available for communicating with the gateway 5100 on the basis of the IoT technology may include a home appliance 5300 such as a television 5310 or a refrigerator 5320, a digital door lock 5400, a garage door lock 5500, a light switch 5600 installed on a wall, or the like, a router 5700 for relaying a wireless communications network, and a mobile device 5800 such as a smartphone, a tablet PC, or a laptop computer.

In the network system 5000, the LED lamp 5200 may check operational states of various devices 5300 to 5800 using the wireless communications network (ZigBee, Wi-Fi, Li-Fi, etc.) installed in a household or may automatically control illumination of the LED lamp 5200 itself according to a surrounding environment or situation. Also, the devices 5300 to 5800 included in the network system 500 may be controlled using Li-Fi communications using visible light emitted from the LED lamp 5200.

First, the LED lamp 5200 may automatically adjust illumination of the LED lamp 5200 on the basis of information of a surrounding environment transmitted from the gateway 5100 through the communications module 5210 for a lamp or information of a surrounding environment collected from a sensor installed in the LED lamp 5200. For example, brightness of illumination of the LED lamp 5200 may be automatically adjusted according to types of programs broadcast on the television 5310 or brightness of a screen. To this end, the LED lamp 5200 may receive operation information of the TV 5310 from the communications module 5210 for a lamp connected to the gateway 5100. The communications module 5210 for a lamp may be integrally modularized with a sensor and/or a controller included in the LED lamp 5200.

For example, in a case in which a program broadcast on a TV is a drama, a color temperature of illumination may be decreased to be 12000K or lower, for example, to 5000K, and a color tone may be adjusted according to preset values, to present a cozy atmosphere. Conversely, when a program is a comedy, the network system 5000 may be configured so that a color temperature of illumination is increased to 5000K or higher according to a preset value and illumination is adjusted to white illumination based on a blue color.

Also, in a case in which no one is at home, when a time has lapsed after a digital door lock 5400 is locked, all of the turned-on LED lamps 5200 may be controlled to turn off to prevent a waste of electricity. Also, in a case in which a security mode is set through the mobile device 5800, or the like, when the digital door lock 5400 is locked with no person in the home, the LED lamp 5200 may be maintained in a turned-on state.

An operation of the LED lamp 5200 may be controlled according to information regarding surrounding environments collected through various sensors connected to the network system 5000. For example, in a case in which the network system 5000 is realized in a building, lighting, a position sensor, and a communications module are combined in the building, and position information of people in the building is collected and lighting is turned on or turned off, or the collected information may be provided in real time to effectively manage facilities or effectively utilize idle space. In general, a lighting device such as the LED lamp 5200 is disposed in almost every space of each floor of a building, and thus, various types of information of the building may be collected through a sensor integrally provided with the LED lamp 5200 and used for managing facilities and utilizing idle space.

The LED lamp 5200 may be combined with an image sensor, a storage device, and the communications module 5210 for a lamp, to be utilized as a device for maintaining building security or to sense and cope with an emergency situation. For example, in a case in which a smoke or temperature sensor, or the like, is attached to the LED lamp 5200, a fire may be promptly sensed and damage may be minimized. Also, brightness of lighting may be adjusted in consideration of outside weather or an amount of sunshine, thereby saving energy and providing an agreeable illumination environment.

As described above, the network system 5000 may also be applied to an open space such as a street or a park, as well as to a closed space such as a house, an office, or a building. In a case in which the network system 5000 is intended to be applied to an open space without a physical limitation, it may be difficult to realize the network system 5000 due to a limitation in a distance of wireless communications or communications interference due to various obstacles. In this case, a sensor, a communications module, and the like, may be installed in each lighting fixture, and each lighting fixture may be used as an information collector or a communications relay, whereby the network system 5000 may be more effectively realized in an open environment. This will hereinafter be described with reference to FIG. 37.

FIG. 37 is a view illustrating an example embodiment of a network system 6000 applied to an open space.

Referring to FIG. 37, a network system 6000 according to the present example embodiment may include a communications connection device 6100, a plurality of lighting fixtures 6200 and 6300 installed at intervals and connected to be available for communicating with the communications connection device 6100, a server 6400, a computer 6500 managing the server 6400, a communications base station 6600, a communications network 6700, a mobile device 6800, and the like.

Each of the plurality of lighting fixtures 6200 and 6300 installed in an open outer space such as a street or a park may include smart engines 6210 and 6310, respectively. The smart engines 6210 and 6310 may include a light emitting device emitting light, a driver driving the light emitting device, a sensor collecting information of a surrounding environment, a communications module, and the like. The smart engines 6210 and 6310 may communicate with other neighboring equipment by means of the communications module according to communications protocols such as Wi-Fi, ZigBee, and Li-Fi.

For example, one smart engine 6210 may be connected to communicate with another smart engine 6310. Here, a Wi-Fi extending technique (Wi-Fi mesh) may be applied to communications between the smart engines 6210 and 6310. The at least one smart engine 6210 may be connected to the communications connection device 6100 connected to the communications network 6700 by wired/wireless communications. In order to increase communications efficiency, some smart engines 6210 and 6310 may be grouped and connected to the single communications connection device 6100.

The communications connection device 6100 may be an access point (AP) available for wired/wireless communications, which may relay communications between the communications network 6700 and other equipment. The communications connection device 6100 may be connected to the communications network 6700 in either a wired manner or a wireless manner, and for example, the communications connection device 6100 may be mechanically received in any one of the lighting fixtures 6200 and 6300.

The communications connection device 6100 may be connected to the mobile device 6800 through a communications protocol such as Wi-Fi, or the like. A user of the mobile device 6800 may receive surrounding environment information collected by the plurality of smart engines 6210 and 6310 through the communications connection device 6100 connected to the smart engine 6210 of the lighting fixture 6200 adjacent to the mobile device 6800. The surrounding environment information may include nearby traffic information, weather information, and the like. The mobile device 6800 may be connected to the communications network 6700 according to a wireless cellular communications scheme such as 3G or 4G through the communications base station 6600.

The server 6400 connected to the communications network 6700 may receive information collected by the smart engines 6210 and 6310 respectively installed in the lighting fixtures 6200 and 6300 and may monitor an operational state, or the like, of each of the lighting fixtures 6200 and 6300. In order to manage the lighting fixtures 6200 and 6300 on the basis of the monitoring results of the operational states of the lighting fixtures 6200 and 6300, the server 6400 may be connected to the computer 6500 providing a management system. The computer 6500 may execute software, or the like, capable of monitoring and managing operational states of the lighting fixtures 6200 and 6300, specifically, the smart engines 6210 and 6310.

In order to transmit information collected by the smart engines 6210 and 6310 to the mobile device 6800 of the user, various communications schemes may be applied. Referring to FIG. 37, information collected by the smart engines 6210 and 6310 may be transmitted to the mobile device 6800 through the communications connection device 6100 connected to the smart engines 6210 and 6310, or the smart engines 6210 and 6310 and the mobile device 6800 may be connected to directly communicate with each other. The smart engines 6210 and 6310 and the mobile device 6800 may directly communicate with each other by visible light communications (Li-Fi). This will hereinafter be described with reference to FIG. 38.

FIG. 38 is a block diagram illustrating a communications operation between the smart engine 6210 of the lighting fixture 6200 and the mobile device 6800 according to visible light communications. Referring to FIG. 38, the smart engine 6210 may include a signal processor 6211, a controller 6212, an LED driver 6213, a light source unit 6214, a sensor 6215, and the like. The mobile device 6800 connected to the smart engine 6210 by visible light communications may include a controller 6801, a light receiver 6802, a signal processor 6803, a memory 6804, an input/output 6805, and the like.

The visible light communications (VLC) technology (or light fidelity (Li-Fi)) is a wireless communications technology transferring information wirelessly by using light having a visible light wavelength band recognizable by the naked eye. The visible light communications technology is distinguished from existing wired optical communications technology and infrared data association (IrDA) in that it uses light having a visible light wavelength band, namely, a particular visible light frequency from the light emitting device package according to the example embodiment described above and is distinguished from the existing wired optical communications technology in that a communications environment is based on a wireless scheme. Also, unlike RF wireless communications, the VLC technology (or Li-Fi) has excellent convenience and physical security properties as it can be freely used without being regulated or needing permission in the aspect of frequency usage, and is differentiated in that a user can physically check a communications link, and above all, the VLC technology (or Li-Fi) has features of convergence technology that obtains both a unique purpose as a light source and a communications function.

Referring to FIG. 38, the signal processor 6211 of the smart engine 6210 may process data intended to be transmitted and received by VLC. In an example embodiment, the signal processor 6211 may process information collected by the sensor 6215 into data and transmit the processed data to the controller 6212. The controller 6212 may control operations of the signal processor 6211 and the LED driver 6213, and in particular, the controller 6212 may control an operation of the LED driver 6213 on the basis of data transmitted from the signal processor 6211. The LED driver 6213 emits the light source unit 6214 according to a control signal transmitted from the controller 6212, thereby transmitting data to the mobile device 6800.

The mobile device 6800 may include the light receiver 6802 for recognizing visible light including data, in addition to the controller 6801, the memory 6804 storing data, the input/output unit 6805 including a display, a touchscreen, an audio output unit, and the like, and the signal processor 6803. The light receiver 6802 may sense visible light and convert the sensed visible light into an electrical signal, and the signal processor 6803 may decode data included in the electrical signal converted by the light receiver 6802. The controller 6801 may store the data decoded by the signal processor 6803 in the memory 6804 or may output the decoded data through the input/output 6805 to allow the user to recognize the data.

As set forth above, according to example embodiments, the wavelength conversion film included in the light emitting device package may include a plurality of phosphor layers stacked on each other, and each of the phosphor layers may have a plurality of phosphor structures having a wavelength conversion material. Accordingly, since a probability in which light emitted from a light emitting device is absorbed by the wavelength conversion material is increased, light conversion efficiency is improved, and since spaces between the plurality of phosphor structures are filled with a transparent resin, light extraction efficiency may be increased.

While example embodiments have been shown and described above, it will be apparent to those skilled in the art that modifications and variations could be made without departing from the scope of the inventive concept as defined by the appended claims.

What is claimed is:

1. A light emitting device package comprising:
a light emitting device including a substrate, and a light emitting structure having a first conductivity-type semiconductor layer, an active layer, and a second conductivity-type semiconductor layer stacked on the substrate; and
a wavelength conversion film disposed in a path of light emitted by the light emitting device and having a plurality of phosphor layers stacked on each other,
wherein at least a portion of the plurality of phosphor layers includes a plurality of phosphor structures comprising a wavelength conversion material receiving light emitted from the light emitting device and converting a wavelength thereof and a binding resin binding the wavelength conversion material, and a transparent resin filling spaces between the plurality of phosphor structures.

2. The light emitting device package of claim 1, wherein the plurality of phosphor structures each has a rod shape and are arranged in a direction within the at least a portion of the plurality of phosphor layers.

3. The light emitting device package of claim 2, wherein the plurality of phosphor structures are disposed to be spaced apart from one another by a distance in each of the at least a portion of the plurality of phosphor layers.

4. The light emitting device package of claim 1, wherein the plurality of phosphor structures each have a polygonal shape and are repeatedly arranged.

5. The light emitting device package of claim 1, wherein the plurality of phosphor structures each have a fiber shape and are arranged in a random direction in each of the at least a portion of the plurality of phosphor layers.

6. The light emitting device package of claim 1, wherein the at least a portion of the plurality of phosphor layers includes a first phosphor layer having a plurality of phosphor structures and disposed on the light emitting device, and a second phosphor layer having a plurality of second phosphor structures and disposed on the first phosphor layer.

7. The light emitting device package of claim 6, wherein the plurality of first phosphor structures have a rod shape extending in a first direction, and the plurality of second phosphor structures have a rod shape extending in a second direction crossing the first direction.

8. The light emitting device package of claim 7, wherein the plurality of first phosphor structures and the plurality of second phosphor structures are disposed in a three-dimensional (3D) matrix form within the wavelength conversion film.

9. The light emitting device package of claim 6, wherein the plurality of first phosphor structures include a first wavelength conversion material, the plurality of second phosphor structures include a second wavelength conversion material, and the first wavelength conversion material converts light emitted from the light emitting device into light having a first wavelength and the second wavelength conversion material converts light emitted from the light emitting device into light having a second wavelength that is different from the first wavelength.

10. The light emitting device package of claim 9, wherein the first wavelength is longer than the second wavelength.

11. The light emitting device package of claim 6, wherein the transparent resin included in the second phosphor layer has a refractive index lower than a refractive index of the transparent resin included in the first phosphor layer.

12. The light emitting device package of claim 1, further comprising a package body attached to at least one of the light emitting device and the wavelength conversion film.

13. The light emitting device package of claim 12, wherein the package body includes a reflective wall disposed to be adjacent to a side surface of the light emitting device.

14. A wavelength conversion film comprising:
a plurality of phosphor structures, each comprising a wavelength conversion material and a binding resin binding the wavelength conversion material; and
a transparent resin filling spaces between the plurality of phosphor structures,
wherein at least a portion of the plurality of phosphor structures are stacked on each other to provide a plurality of phosphor layers,
wherein the plurality of phosphor structures include a plurality of first phosphor structures included in a first phosphor layer and having a first wavelength conversion material, and a plurality of second phosphor structures included in a second phosphor layer disposed on the first phosphor layer and having a second wavelength conversion material, and
wherein the first phosphor layer comprises the transparent resin between the first phosphor structures, and the second phosphor layer comprise the transparent resin between the second phosphor structures.

15. The wavelength conversion film of claim 14, wherein the first wavelength conversion material emits light having a first wavelength, and the second wavelength conversion material emits light having a second wavelength, the first wavelength being longer than the second wavelength.

16. A light emitting device package comprising:
a light emitting device that emits light along an optical path; and
a wavelength conversion film disposed in the optical path to convert a wavelength of the light, the wavelength conversion film comprising:
a first phosphor layer including a plurality of first phosphor structures, each first phosphor structure comprising a first wavelength conversion material and a first binding resin binding the first wavelength conversion material, the first phosphor layer comprising a first transparent resin between the plurality of first phosphor structures; and
a second phosphor layer including a plurality of second phosphor structures, each second phosphor structure comprising a second wavelength conversion material and a second binding resin binding the second wavelength conversion material, the second phosphor layer comprising a second transparent resin between the plurality of second phosphor structures.

17. The light emitting device package of claim 16, wherein the first wavelength conversion material converts light emitted from the light emitting device into light having a first wavelength and the second wavelength conversion material converts light emitted from the light emitting device into light having a second wavelength that is different from the first wavelength.

18. The light emitting device package of claim 17, wherein the first phosphor layer of the wavelength conversion film is disposed on the light emitting device and the second phosphor layer of the wavelength conversion film is disposed on the first phosphor layer, and the first wavelength is longer than the second wavelength.

19. The light emitting device package of claim 16, wherein the second transparent resin has a refractive index lower than a refractive index of the first transparent resin.

* * * * *